United States Patent
Ochiai et al.

(10) Patent No.: US 9,886,928 B2
(45) Date of Patent: *Feb. 6, 2018

(54) GATE SIGNAL LINE DRIVE CIRCUIT

(71) Applicant: Japan Display Inc., Tokyo (JP)

(72) Inventors: Takahiro Ochiai, Tokyo (JP);
Motoharu Miyamoto, Tokyo (JP);
Masahiro Hoshiba, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/584,074

(22) Filed: May 2, 2017

(65) Prior Publication Data

US 2017/0236482 A1    Aug. 17, 2017

Related U.S. Application Data

(63) Continuation of application No. 14/497,388, filed on Sep. 26, 2014, now Pat. No. 9,672,783.

(30) Foreign Application Priority Data

Sep. 27, 2013  (JP) .................................. 2013-202602

(51) Int. Cl.
*G09G 3/36* (2006.01)
(52) U.S. Cl.
CPC .......... *G09G 3/3677* (2013.01); *G09G 3/3648* (2013.01); *G09G 2310/0286* (2013.01); *G09G 2310/08* (2013.01); *G09G 2330/021* (2013.01)
(58) Field of Classification Search
CPC ............... G09G 3/3677; G09G 2310/0286

USPC .................................. 345/98–100; 377/64–81
See application file for complete search history.

(56) References Cited

U.S. PATENT DOCUMENTS 9,042,509 B2   5/2015  Yu et al.
2012/0008731 A1   1/2012  Hsu et al.

FOREIGN PATENT DOCUMENTS

JP    2011-85663 A    4/2011
JP    2013-530478 A   7/2013

OTHER PUBLICATIONS

Japanese Office Action dated Jul. 18, 2017 for corresponding Japanese Patent Application No. 2013-202602, with partial translation.

*Primary Examiner* — Michael Pervan
(74) *Attorney, Agent, or Firm* — Typha IP LLC

(57) ABSTRACT

A gate signal line drive circuit whose power consumption is reduced, is provided. In the gate signal line drive circuit having plural basic circuits outputting respective gate signals, each basic circuit includes a high voltage application switching element to which a first basic clock signal having high voltage in a signal high period is input, a low voltage application switching element that turns on at timing starting a signal low period, and outputs a low voltage, and a first low voltage application on control element having an input terminal to which a second basic clock signal subsequent to the first basic clock signal is input, and which turns on according to the signal high period, and outputs the voltage of the second basic clock signal to the control terminal of the low voltage application switching element.

6 Claims, 17 Drawing Sheets

PRIOR ART

GATE SIGNAL LINE DRIVE CIRCUIT

CROSS-REFERENCE TO RELATED APPLICATIONS

This application is a continuation of U.S. patent application Ser. No. 14/497,388, filed on Sep. 26, 2014. Further, this application claims priority from Japanese application No. 2013-202602, filed on Sep. 27, 2013, the contents of which are hereby incorporated by reference into this application.

BACKGROUND OF THE INVENTION

1. Field of the Invention

The present invention relates to a gate signal line drive circuit and a display device using the drive circuit. In particularly, the present invention relates to a reduction in power consumption in a gate signal line drive circuit.

2. Description of the Related Art

Up to now, for example, liquid crystal display devices may employ a system in which a shift register circuit disposed in a gate signal line drive circuit that scans gate signal lines is formed on the same substrate as that of thin film transistors (hereinafter referred to as "TFT") which are arranged in a pixel area of a display screen, that is, a shift register built-in system.

The shift register circuit disposed in the gate signal line drive circuit outputs gate signals $G_n$ which become high voltage in a signal high period which is cyclically repeated, and low voltage in a signal low period which is a period other than the signal high period to corresponding gate signal lines.

FIG. 16 is a circuit diagram illustrating a basic circuit of a shift register circuit in a related art. A transistor T5 is a high voltage application switching element that applies a high voltage to the gate signal lines according to the signal high period. A basic clock signal $V_n$ is input to an input terminal of the transistor T5. The basic clock signal $V_n$ is a clock signal repeated, for example, with four clocks as one cycle, and becomes high voltage in a clock which is a signal high period (period P3) of a gate signal $G_n$ as with a basic clock signal $V_n$ according to the present invention illustrated in FIG. 5.

It is assumed that a voltage to be applied to a gate of the transistor T5 is a node N1, and a voltage to be applied to a gate of a transistor T6 is a node N2. The node N1 and the node N2 become high voltage and low voltage in a period P2 to a period P4, respectively, as with a node N1 and a node N2 according to the present invention illustrated in FIG. 5. In the above period, the transistor T5 becomes in an on state, and outputs a voltage of the basic clock signal $V_n$ to an output terminal OUT connected to the gate signal line. In the period, the transistor T6 is maintained in an off state.

SUMMARY OF THE INVENTION

The basic clock signal $V_n$ is input to the input terminal of the transistor T5 illustrated in FIG. 16. The transistor T5 is maintained in the off state according to the signal low period. However, since a charge and discharge current flows in the transistor T5 due to a parasitic capacitance provided in the transistor T5 every time a voltage of the basic clock signal $V_n$ changes, a power consumption increases.

Since the parasitic capacitance can be reduced with a reduction in the element size of the transistor T5, the charge and discharge current generated in the transistor T5 can be suppressed. The transistor T6 becomes in the off state before and after the signal high period (period P2 to period P4 illustrated in FIG. 5), and a load caused by a voltage change of the gate signal line is exerted on the transistor T5 that is in the on state.

FIG. 17 is a diagram illustrating a signal waveform of the gate signal in the related art. FIG. 17 illustrates signal waveforms of a gate signal $G_n$ output by a basic circuit of a shift register circuit according to the related art illustrated in FIG. 16. The signal waveforms of the gate signal $G_n$ illustrated in FIG. 17 are newly measured for the purpose of evaluating the gate signal related to the related art by the present inventors. FIG. 17 illustrates the signal waveforms when a channel width of the transistor T5 is reduced from 3500 μm to 1500 μm at the intervals of 500 μm. In this example, it is assumed that a signal waveform in which the gate signal $G_n$ changes from the low voltage to the high voltage is a rising waveform, and a signal waveform in which the gate signal $G_n$ changes from the high voltage to the low voltage is a falling waveform. With a reduction in the element size of the transistor T5, the rising waveforms and the falling waveforms of the gate signal $G_n$ change in directions indicated by arrows in the figure, and blunting increases. Even if the rising waveform of the gate signal $G_n$ is blunted, it is sufficient that the gate signal $G_n$ rises to a sufficiently saturated state so that a switching transistor of each pixel circuit sufficiently turns on at timing when the pixel circuit writes the pixel. However, as indicated by a dashed line in FIG. 17, if the falling waveform of the gate signal $G_n$ is increasingly blunted, the gate signal $G_n$ does not sufficiently drop to the low voltage even after the pixel circuit writes the pixel, the pixel voltage held by the pixel circuit is varied by rewrite without sufficiently turning off the switching transistor of the pixel circuit, and the quality of a display screen is degraded, for example, the brightness is reduced.

JP 2011-085663 A discloses a signal output circuit 241 having a transistor TG that changes an output $G_i$ (gate signal) to low at timing when a clock $V_i$ input to a transistor T5, which is a high voltage application switching element, changes from high to low (refer to FIG. 4 in JP 2011-85663 A). An output $G_{i+4}$ in a subsequent stage is input to a gate of a transistor TG. At a time t4 (refer to FIG. 5 in JP 2011-85663 A) when the clock $V_i$ changes from high to low, the output $G_{i+4}$ changes from low to high, the transistor TG is rendered conductive, and the output Gi is connected to VGPL which is low. The transistor TG functions to change the output $G_i$ from high to low.

However, as with the rising waveform of the gate signal as illustrated in FIG. 17, since the rising waveform of the output $G_i$ is blunted, the output $G_i$ does not sufficiently change to high at the time of rising in fact. Hence, the conduction of the transistor TG is not sufficient, and the transistor TG cannot sufficiently contribute to a sufficient change of the output $G_i$ from high to low at the time of rising. For that reason, most of a load generated by a voltage change of the gate signal line at the time of rising is still exerted on the transistor T5. That is, it is still difficult to reduce the element size of the transistor T5 by only adding the transistor TG.

The present invention has been made in view of the above problem, and therefore aims at providing a gate signal line drive circuit that reduces a power consumption, and a display device using the gate signal line drive circuit.

(1) According to the present invention, there is provided a gate signal line drive circuit including a plurality of basic circuits that output respective gate signals which become high voltage in a signal high period which is cyclically repeated, and become low voltage in a signal low period which is a period other than the signal high period to corresponding gate signal lines. Each of the basic circuits includes: a high voltage application switching element having an input terminal and a control terminal in which a first basic clock signal that is repeated with m clocks (m is an integer equal to or higher than 3) as one cycle, and becomes high voltage in a clock which is the signal high period, and becomes low voltage in the other clocks is input to the input terminal of the high voltage application switching element, and the high voltage is applied to the control terminal of the high voltage application switching element according to the signal high period, to output a voltage of the first basic clock signal to the corresponding gate signal line; a low voltage application switching element having a control terminal to which the high voltage is applied at timing to change from the signal high period to the signal low period, to output the low voltage to the corresponding gate signal line; and a first low voltage application on control element having an input terminal and a control terminal in which a second basic clock signal that is repeated with the m clocks as one cycle, and becomes high voltage in a clock subsequent to the clock in which the first basic clock signal becomes high voltage, and becomes low voltage in the other clocks is input to the input terminal of the first low voltage application on control element, and the high voltage is applied to the control terminal of the first low voltage application on control element according to the signal high period, to output a voltage of the second basic clock signal to the control terminal of the low voltage application switching element at least at timing when the second basic clock signal changes from the low voltage to the high voltage.

(2) In the gate signal line drive circuit according to the above item (1), the plurality of basic circuits may include a first basic circuit, and a second basic circuit, the signal high period of the second basic circuit may start within one clock after a start of the signal high period of the first basic circuit, and the control terminal of the high voltage application switching element in the second basic circuit may be connected to the control terminal of the low voltage application on control element in the first basic circuit.

(3) In the gate signal line drive circuit according to the above item (1) or (2), each of the basic circuits may further include: a first low voltage application off control element that turns on after the first low voltage application on control element outputs the high voltage of the second basic clock signal to the control terminal of the low voltage application switching element, and outputs the low voltage to the control terminal of the low voltage application switching element.

(4) In the gate signal line drive circuit according to the above item (3), a third basic clock signal that is repeated with the m clocks as one cycle, and becomes high voltage in a clock subsequent to the clock in which the second basic clock signal becomes high voltage, and becomes low voltage in the other clocks may be input to the control terminal of the first low voltage application off control element, and the first low voltage application off control element may become in the on state when the third basic clock signal becomes high voltage.

(5) In the gate signal line drive circuit according to any one of the above items (1) to (4), m of the m clocks is an integer of 4 or higher, each of the basic circuits further comprises a second low voltage application on control element having an input terminal and a control terminal in which a fourth basic clock signal that is repeated with the m clocks as one cycle, and becomes high voltage in a clock previous to the clock in which the first basic clock signal becomes high voltage, and becomes low voltage in the other clocks is input to the input terminal of the second low voltage application on control element, and the high voltage is applied to the control terminal of the second low voltage application on control element according to the signal high period, to output a voltage of the fourth basic clock signal to the control terminal of the low voltage application switching element at least at timing when the fourth basic clock signal changes from the low voltage to the high voltage, forward scanning in which the gate signals output by the plurality of basic circuits become the signal high period in a forward order is driven, and the fourth basic clock signal is input to the input terminal of the first low voltage application on control element instead of the second basic clock signal, and the second basic clock signal is input to the input terminal of the second low voltage application on control element instead of the fourth basic clock signal, to drive reverse scanning in which the gate signals output by the plurality of basic circuits become the signal high period in a reverse order of the forward order.

(6) According to the present invention, there may be provided a display device including the gate signal line drive circuit according to any one of the above items (1) to (5).

According to the present invention, there are provided the gate signal line drive circuit whose power consumption is reduced, and the display device using the drive circuit.

DETAILED DESCRIPTION OF THE INVENTION

Hereinafter, embodiments of the present invention will be described with reference to the accompanying drawings specifically and in detail. In all of drawings illustrating the embodiments, members having the same function are denoted by identical symbols, and a repetitive description thereof will be omitted. Also, the drawings described below illustrate examples of the embodiments, and sizes of the drawings do not always match reduced sizes described in the examples.

First Embodiment

Figure 1:
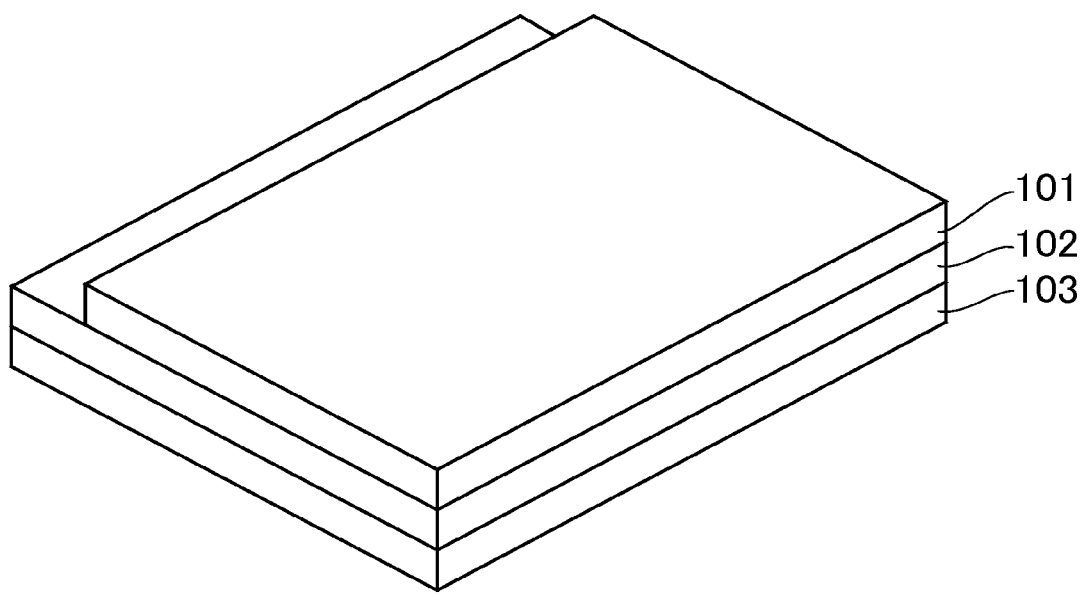
FIG. 1 is a perspective view illustrating an overall liquid crystal display device according to a first embodiment of the present invention.

A display device according to a first embodiment of the present invention is, for example, an IPS (in-plane switching) liquid crystal display device. FIG. 1 is a perspective view of an overall liquid crystal display device according to the first embodiment. As illustrated in FIG. 1, the liquid crystal display device according to the embodiment includes a TFT substrate 102 on which gate signal lines 105, video signal lines 107, pixel electrodes 110, a common electrode 111, and TFTs 109, which will be describe later, are arranged, a filter substrate 101 that faces the TFT substrate 102, and has color filters disposed thereon, a liquid crystal material that is sealed in an area sandwiched between those substrates, and a backlight 103 that is located in contact with a side of the TFT substrate 102 opposite to the filter substrate 101 side.

Figure 2:
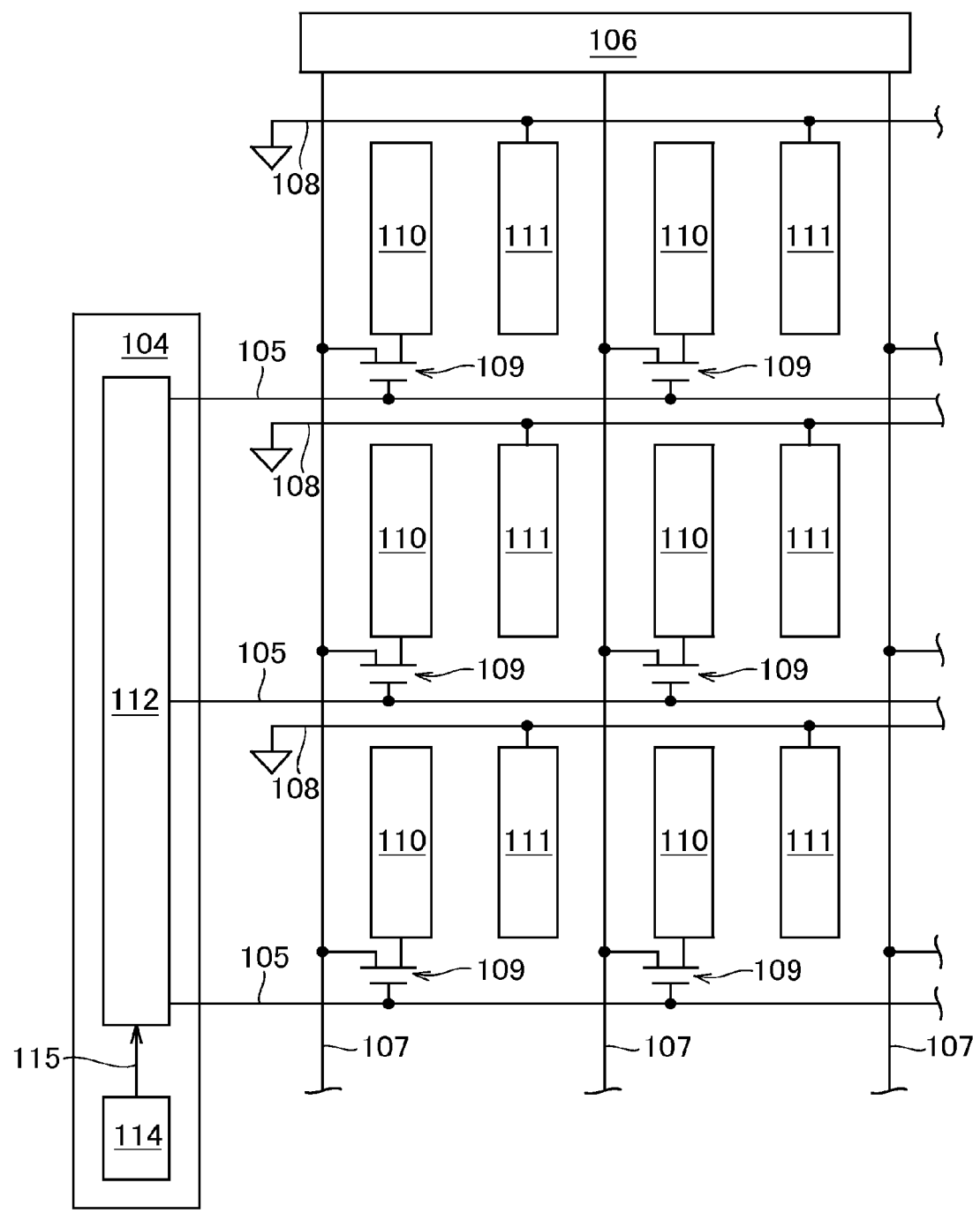
FIG. 2 is a conceptual diagram illustrating an equivalent circuit of a TFT substrate according to the first embodiment of the present invention.

FIG. 2 is a conceptual diagram illustrating an equivalent circuit of the TFT substrate 102 according to this embodiment. Referring to FIG. 2, a large number of the gate signal lines 105 connected to a gate signal line drive circuit 104 extend at regular intervals in a lateral direction of the figure on the TFT substrate 102.

The gate signal line drive circuit 104 includes a shift register control circuit 114 and a shift register circuit 112, and the shift register control circuit 114 outputs a control signal 115, which will be described later, to the shift register circuit 112.

The shift register circuit 112 includes a plurality of basic circuits 113 in correspondence with the plural gate signal lines 105. For example, if there are 800 gate signal lines 105, 800 basic circuits 113 are provided in the shift register circuit 112, likewise. Each of the basic circuits 113 outputs agate signal that becomes high voltage in a signal high period cyclically repeated, and becomes low voltage in a period (signal low period) other than the signal high period to the corresponding gate signal line 105 through the control signal 115 input from the shift register control circuit 114. That is, each of the basic circuits 113 outputs, to a corresponding gate signal line 105, the high voltage in the signal high period, and the low voltage in the signal low period. For simplification of description, in FIG. 2, the shift register circuit 112 is illustrated on only a left side of FIG. 2. However, in fact, an odd shift register circuit that outputs gate signals to odd gate signal lines 105 (400) is located on a right side of FIG. 2, and an even shift register circuit that outputs the gate signals to even gate signal lines 105 (400) is located on a left side of FIG. 2.

Also, a large number of the video signal lines 107 connected to a data drive circuit 106 extend at regular intervals in a longitudinal direction of FIG. 2. Pixel areas arranged in a grid are partitioned by the gate signal lines 105 and the video signal lines 107. Also, common signal lines 108 extend in parallel to the respective gate signal lines 105 in the lateral direction of FIG. 2.

The TFT 109 (switching transistor) is formed in a corner of each of the pixel areas partitioned by the gate signal lines 105 and the video signal lines 107, and connected to the corresponding video signal line 107 and the corresponding pixel electrode 110. Further, the gate of the TFT 109 is connected to the gate signal lines 105. Also, a common electrode 111 is formed in each of the pixel areas so as to face the pixel electrode 110.

In the above circuit configuration, a reference voltage is applied to the common electrode 111 in each of the pixel circuits through the corresponding common signal line 108. Also, a gate voltage is selectively applied to a gate of each of the TFTs 109 through the corresponding gate signal line 105, to thereby control a current that flows in the TFT 109. A voltage of a video signal supplied to the video signal line 107 is applied to the pixel electrode 110 through the TFT 109 having the gate applied with the gate voltage. With the above operation, a potential difference is generated between the pixel electrode 110 and the common electrode 111 to control orientations of liquid crystal molecules, as a result of which the degree of shielding of light from the backlight 103 is controlled to display an image.

Figure 3:
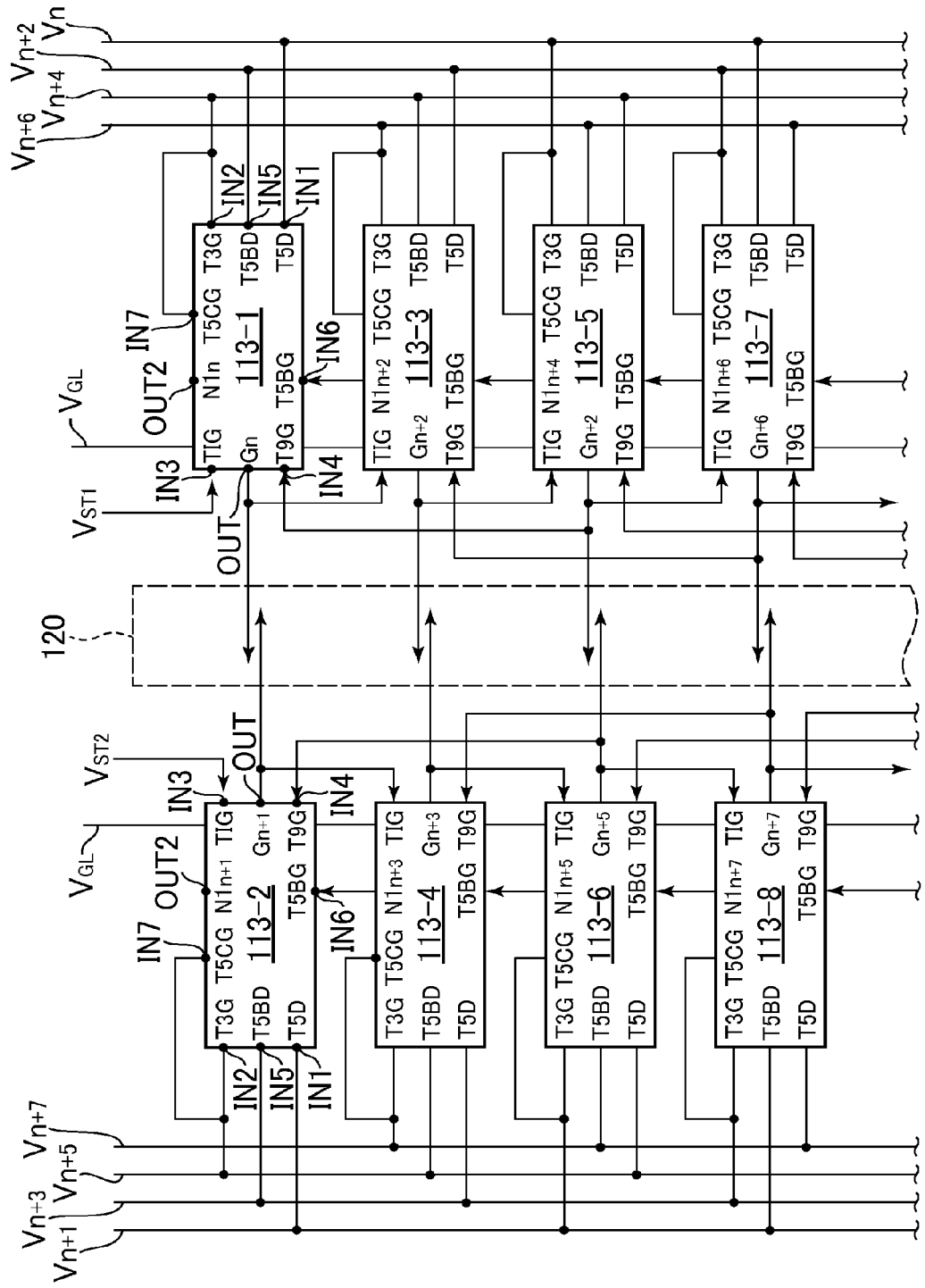
FIG. 3 is a block diagram illustrating a shift register circuit according to the first embodiment of the present invention.

FIG. 3 is a block diagram illustrating the shift register circuit 112 according to this embodiment. For example, if 800 gate signal lines 105 are present, 800 basic circuits 113 corresponding to the respective 800 gate signal lines 105 are provided in the shift register circuit 112. As described above, 400 odd basic circuits corresponding to the respective odd gate signal lines 105 (400) are located on a right side of a display area 120, and 400 even basic circuits corresponding to the respective even gate signal lines 105 (400) are located on a left side of the display area 120. FIG. 3 illustrates eight basic circuits 113 of n=1 to 8 among 800 basic circuits 113. In FIG. 3, an n-th basic circuit is generally referred to as "basic circuit 113-n".

The control signal 115 output to the shift register circuit 112 by the shift register control circuit 114 includes basic clock signals $V_1$ to $V_8$, a low voltage line $V_{GtT}$ that applies the low voltage, and auxiliary signals $V_{ST1}$, $V_{ST2}$.

Generally, m-phase basic clock signals will be described. The m-phase basic clock signals are clock signals different in phase from each other in a given cycle T. When it is assumed that a cycle of the basic clock signal is T, one cycle T of the m-phase basic clock signals is subdivided into m periods of T/m. When a period of T/m is called "one clock", one cycle T includes m clocks. Each clock signal of the m-phase basic clock signals is a signal that becomes high voltage in one clock, and becomes low voltage in the other clocks, in each cycle T.

In this embodiment, four-phase basic clock signals $V_1$, $V_3$, $V_5$, and $V_7$ become high voltage in the stated order for each of the clocks in one cycle T, and become low voltage in the other clocks. Four-phase basic clock signals $V_2$, $V_4$, $V_6$, and $V_8$ are clock signals that become high voltage with a delay of half clock from the four-phase basic clock signals $V_1$, $V_3$. $V_5$, and $V_7$, respectively. When it is assumed that a period during which a video signal is written per pixel is one horizontal scanning period (1H period), one clock of the basic clock signal has a length of two horizontal scanning periods (2H periods). That is, in the gate signal line drive circuit 104 according to this embodiment, the signal high periods of the gate signals $G_n$ and $G_{n+1}$ that are supplied to the respective two adjacent gate signal lines 105 overlap with each other by half clocks (1H period), to conduct 1H overlap drive.

As illustrated in basic circuits 113-1 and 113-2 in FIG. 3, each of the basic circuits 113 illustrated in FIG. 3 includes seven input terminals IN1, IN2, IN3, IN4, IN5, IN6, IN7, and two output terminals OUT, OUT2. The gate signal $G_n$ is output to the display area 120 from the output terminal OUT of an n-th basic circuit 113-n. Also, the output terminal OUT2 is connected to a node N1 which will be described later.

The basic clock signal $V_n$ is input to the input terminal IN1 of the n-th basic circuit 113-n, a basic clock signal $V_{n+2}$ is input to the input terminal IN5, and a basic clock signal $V_{n+4}$ is input to the input terminals IN2 and IN7. FIG. 3 illustrates a first basic circuit 113-1 as an example of the n-th basic circuit 113-n. That is, a basic clock signal input to the input terminal IN1 of the first basic circuit 113-1 is indicated as the basic clock signal $V_n(=V_1)$, a basic clock signal input to the input terminal IN5 is indicated as the basic clock signal $V_{n+2}(=V_3)$, and a basic clock signal input to the input terminals IN2 and IN7 is indicated as the basic clock signal $V_{n+4}(=V_5)$. Also, a gate signal $G_{n-2}$ output by an (n-2)-th basic circuit 113-(n-2) is input to the input terminal IN3 of the n-th basic circuit 113-n, and a gate signal $G_{n+4}$ output by an (n+4)-th basic circuit 113-(n+4) is input to the input terminal IN4. A node $N1_{n+2}$ output from the output terminal OUT2 of the (n+2)-th basic circuit 113-(n+2) is connected to the input terminal IN6 of the n-th basic circuit 113-n.

"n" of the basic clock signal $V_n$ corresponds to "n" of the n-th basic circuit 113-n. However, since "n" of a real basic clock signal $V_n$ takes only any one of values 1 to 8, if the value of "n" of the basic circuit 113 exceeds 8, the value can be subjected to conversion with the use of $V_{n-8}=V_n=V_{n|8}$. The basic clock signal $V_n$ indicates any basic clock signal of $V_1$ to $V_8$. That is, the "n" of the basic clock signal $V_n$ can be converted by $[\{(n-1) \bmod 8\}+1]$. For example, when n=405 is met, the basic clock signal $V_n$ is $V_5$, and the basic clock signal $V_{n+4}$ is $V_1$.

Also, because the input terminals IN3 of the first basic circuit 113-1 and the second basic circuit 113-2 have no respective corresponding gate signals, auxiliary signals $V_{ST1}$ and $V_{ST2}$ are input to those input terminals IN3. Also, because the input terminals IN4 of a 797$^{th}$ basic circuit 113-797 to an 800$^{th}$ basic circuit 113-800 have no respective corresponding gate signals, dummy circuits that are an 801$^{st}$ basic circuit to an 804$^{th}$ basic circuit are provided. Output signals $G_{801}$ to $G_{804}$ which are outputs of the 801$^{st}$ basic circuit (dummy circuit) to the 804$^{th}$ basic circuit (dummy circuit) are input to the input terminals IN4 of the 797$^{th}$ basic circuit 113-797 to the 800$^{th}$ basic circuit 113-800, respectively.

Figure 4:
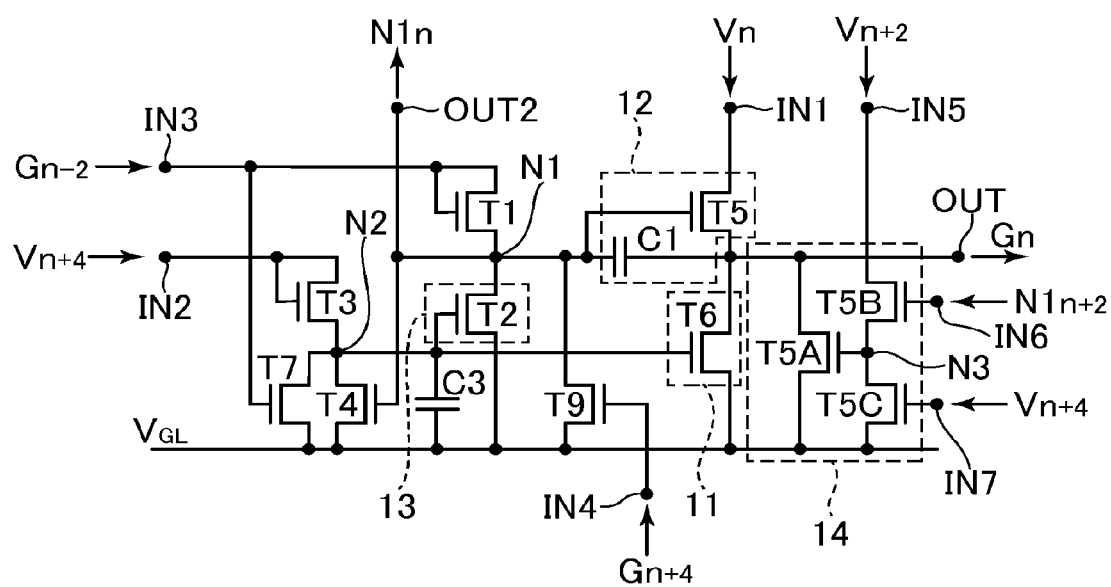
FIG. 4 is a circuit diagram of an n-th basic circuit according to the first embodiment of the present invention.

FIG. 4 is a circuit diagram of the n-th basic circuit 113-n according to this embodiment. All of transistors illustrated in the figure are NMOS transistors (n-channel transistors). The n-th basic circuit 113-n according to this embodiment includes a gate signal line low voltage holding circuit 11, a gate signal line high voltage supply circuit 12, a node N1 low voltage holding circuit 13, and a gate signal line low voltage supply circuit 14. The gate signal line high voltage supply circuit 12 includes a transistor T5 which is a high voltage application switching element, and a boost capacitor C1. The input terminal IN1 is connected to an input terminal of the transistor T5, and an output terminal OUT (corresponding gate signal line 105) is connected to an output terminal of the transistor T5. Since the basic clock signal $V_n$ (first basic clock signal) is input to the input terminal IN1, the basic clock signal $V_n$ (first basic clock signal) is input to the input terminal of the transistor T5. The basic clock signal $V_n$ is a clock signal that becomes high voltage in the signal high period of the gate signal $G_n$. The transistor T5 becomes in the on state according to the signal high period, and the transistor T5 that is in an on state outputs a voltage of the basic clock signal $V_n$ to the output terminal OUT. That is, the voltage of the basic clock signal $V_n$ is output to the corresponding gate signal line 105 from the output terminal OUT of the n-th basic circuit 113-n as the gate signal $G_n$. The transistor T5 becomes in the off state according to the signal low period. In this example, it is assumed that a voltage to be applied to the gate (control terminal: switch) of the transistor T5 (high voltage application switching element) is the node N1.

The gate signal line low voltage holding circuit 11 becomes in the on state according to the signal low period, and applies a low voltage to the output terminal OUT (corresponding gate signal line 105). Also, the gate signal line low voltage holding circuit 11 becomes in the off state according to the signal high period. The gate signal line low voltage holding circuit 11 includes a transistor T6 which is a low voltage holding switching element. A low voltage line $V_{GL}$ is connected to an input terminal of the transistor T6, and the output terminal OUT (corresponding gate signal line 105) is connected to an output terminal of the transistor T6. It is assumed that a voltage applied to the gate (control terminal) of the transistor T6 (low voltage holding switching element) is the node N2.

The gate signal line low voltage supply circuit 14 includes a low voltage application switching element T5A, a first low voltage application on control element T5B, and a first low voltage application off control element T5C. The low voltage line $V_{GL}$ is connected to an input terminal of the transistor T5A, and the output terminal OUT (corresponding gate signal line 105) is connected to an output terminal of the transistor T5A. It is assumed that a voltage to be applied to agate (control terminal) of the transistor T5A (low voltage application switching element) is a node N3. Hereinafter, the nodes N1, N2, and N3 of the n-th basic circuit 113-n are denoted as nodes $N1_n$, $N2_n$, and $N3_n$.

The input terminal IN5 is connected to an input terminal of the transistor T5B (first low voltage application on control element), the node N3 is connected to an output terminal of the transistor T5B, and the input terminal IN6 is connected to a gate (control terminal) of the transistor T5B. As illustrated in FIG. 3, the basic clock signal $V_{n+2}$ (second basic clock signal) is input to the input terminal IN5, and the node $N1_{n+2}$ of the (n+2)-th basic circuit 113-(n+2) is connected to the input terminal IN6. Hence, the basic clock signal $V_{n+2}$ is input to the input terminal of the transistor T5B. Also, the low voltage line $V_{GL}$ is connected to an input terminal of the transistor T5C (first low voltage application off control element), the node N3 is connected to an output terminal of the transistor T5C, and the input terminal IN7 is connected to a gate (control terminal) of the transistor T5C. As illustrated in FIG. 3, since the basic clock signal $V_{n+4}$ (third basic clock signal) is input to the input terminal IN7, the basic clock signal $V_{n+4}$ is input to the gate of the transistor T5C. In this example, the basic clock signal $V_{n+2}$ (second basic clock signal) is a clock signal which becomes high voltage in a clock subsequent to the clock in which the basic clock signal $V_n$ (first basic clock signal) becomes high voltage, and the basic clock signal $V_{n+4}$ (third basic clock signal) is a clock signal which becomes high voltage in a clock subsequent to the clock in which the basic clock signal $V_{n+2}$ (second basic clock signal) becomes high voltage.

The node N1 low voltage holding circuit 13 becomes in the on state according to the signal low period, and applies the low voltage to the node N1. Also, the node N1 low voltage holding circuit 13 becomes in the off state according to the signal high period. The node N1 low voltage holding circuit 13 includes a transistor T2. The low voltage line $V_{GL}$ is connected to an input terminal of the transistor T2, the node N1 is connected to an output terminal of the transistor T2, and the node N2 is connected to a gate of the transistor T2.

The main feature of the present invention resides in that the n-th basic circuit 113-n includes the transistor T5A which is the low voltage application switching element, and the transistor T5B which is the first low voltage application on control element. The basic clock signal $V_{n+2}$ is input to the input terminal of the transistor T5B. At timing (timing to change from the signal high period to the signal low period) when the voltage at the gate signal $G_n$ changes from the high voltage to the low voltage, that is, at timing when the basic clock signal $V_{n+2}$ changes from the low voltage to the high voltage, the transistor T5B outputs the high voltage of the basic clock signal $V_{n+2}$ to the node N3, and the node N3 changes from the low voltage to the high voltage. The transistor T5B becomes in the on state prior to that timing, and outputs the high voltage of the basic clock signal $V_{n+2}$ to the node N3. However, the transistor T5B has only to become in the on state at least at the above timing. Hence, at the timing when the gate signal $G_n$ changes from the high voltage to the low voltage, the transistor T5A turns on, and outputs the low voltage of the low voltage line $V_{GL}$ to the output terminal OUT. The transistor T5A outputs the low voltage to the output terminal OUT, thereby being capable of stably changing the voltage to be applied to the corresponding gate signal lines 105 from the high voltage to the low voltage more steeply, that is, in a shorter time. That is, the blunting of the falling waveform of the gate signal $G_n$ is suppressed. With the provision of the transistor T5A, the element size of the transistor T5 which is the low voltage application switching element can be reduced, and the power consumption can be reduced. The low voltage line $V_{GL}$ that is maintained at the low voltage which is a constant voltage is connected to the input terminal of the transistor T5A. Hence, unlike the transistor T5, even if the transistor T5A is in the off state over the signal low period, since the voltage to be applied to the input terminal does not change, a charge and discharge current hardly flows into the transistor T5A. Hence, the provision of the transistor T5A hardly contributes to an increase in the power consumption.

Because the node N3 changes from the low voltage to the high voltage steeply, not the gate signal $G_{n+2}$ but the basic clock signal $V_{n+2}$ which is an external signal is used. As compared with the rising waveform of the gate signal, the rising waveform of the basic clock signal $V_{n+2}$ is remarkably inhibited from being blunted, and the basic clock signal $V_{n+2}$ remarkably steeply changes from the low voltage to the high voltage. However, when the basic clock signal $V_{th}$ is input directly to the node N3 without the provision of the transistor T5B, the node N3 cyclically repeats the low voltage and the high voltage. The transistor T5A cyclically turns on over the signal low period, and a threshold voltage $V_{th}$ of the transistor T5A is shifted to a positive side. When the threshold voltage $V_{th}$ is shifted to the positive side, the transistor T5A does not stably turn on at timing when the gate signal $G_n$ changes from the high voltage to the low voltage, and cannot sufficiently output the low voltage to the output terminal OUT, which is not desirable. Hence, the transistor T5B that is the first low voltage application on control element is disposed in the n-th basic circuit 113-n of the present invention. The transistor T5B becomes in the on state prior to the timing when the gate signal $G_n$ changes from the high voltage to the low voltage. The transistor T5B that becomes stably in the on state at the timing when the gate signal $G_n$ changes from the high voltage to the low voltage outputs the high voltage of the basic clock signal $V_{n+2}$ to the node N3. That is, the basic clock signal $V_{n+2}$ cyclically becomes high voltage, and the high voltage is applied to the gate of the transistor T5B in a period when the basic clock signal $V_{n|2}$ becomes high voltage according to the signal high period of the gate signal $G_n$, and the voltage of the basic clock signal $V_{n+2}$ is output to the node N3. Also, in the period when the basic clock signal $V_{n+2}$ becomes high voltage, the transistor T5B is in the off state, and the node N3 is blocked from the basic clock signal $V_{n+2}$. The basic clock signal is input to the input terminal of the transistor T5B, like the input terminal of the transistor T5. However, the transistor T5 becomes in the on state, and applies the voltage of the basic clock signal to the gate signal line. On the other hand, the transistor T5B becomes in the on state, and merely applies the voltage of the basic clock signal to the node N3. In this example, as compared with the gate signal line, a parasitic capacitance generated in the node N3 is remarkably small. Hence, the input basic clock signal cyclically becomes high voltage together, but a load exerted on the transistor T5B is small unlike the transistor T5. For that reason, since the element size of the transistor T5B can be reduced, the power consumption in the transistor T5B is small, and not problematic.

Figure 5:
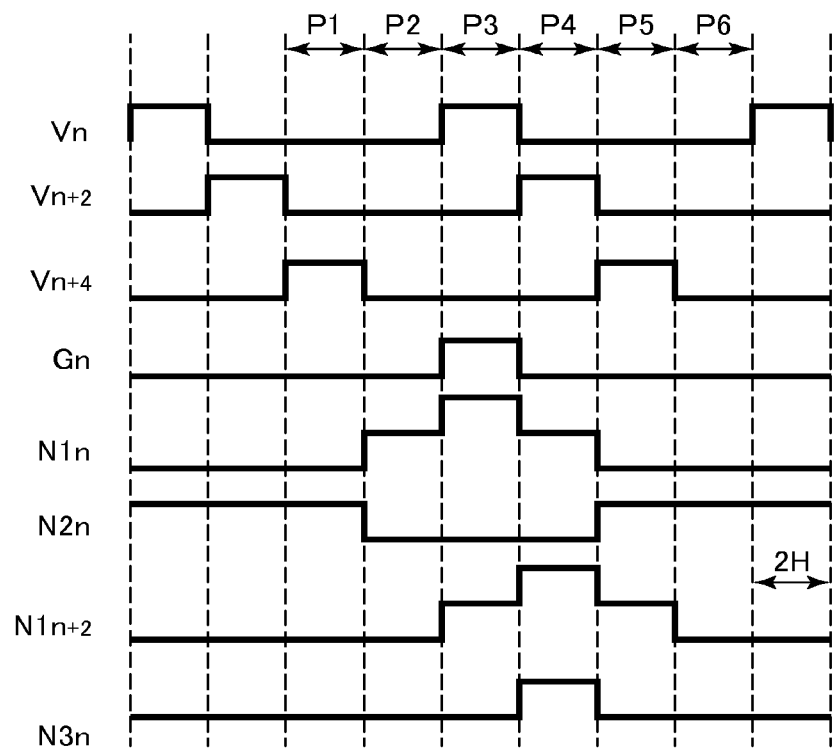
FIG. 5 is a timing chart representing drive operation of a gate signal line drive circuit according to the first embodiment of the present invention.

FIG. 5 is a timing chart representing drive operation of the gate signal line drive circuit 104 according to this embodiment, and illustrates changes of basic clock signals $V_n$, $V_{n+2}$, $V_{n+4}$ the gate signal $G_n$, and the nodes $N1_n$, $N2_n$, $N1_{n+2}$, $N3_n$ in time. One cycle T of four-phase basic clock signals is four clocks, the changes in time illustrated in FIG. 5 are illustrated with one clock as a unit, and the corresponding clocks are defined as periods P1 to P6. As described above, one clock is two horizontal scanning periods (2H periods). In the period P1 and the previous periods, the node N1 and the node N2 are maintained at the low voltage and the high voltage, respectively.

As illustrated in FIG. 4, the input terminal IN3 is connected to the gate and the input terminal of the transistor T1 (diode connection), and the node N1 is connected to the output terminal of the transistor T1. The gate signal $G_{n-2}$ output by the (n−2)-th basic circuit 113-(n−2) is input to the input terminal IN3. Since the gate signal $G_{n-2}$ becomes high voltage in the period P2 illustrated in FIG. 5, the transistor T1 turns on, the transistor T1 applies the high voltage of the gate signal $G_{n-2}$ to the node N1, and the node N1 changes from the low voltage to the high voltage, at a start time of the period P2. Since the node N1 becomes high voltage, the transistor T5 turns on, and the transistor T5 outputs the voltage of the basic clock signal $V_n$ to the output terminal OUT.

Also, the input terminal IN3 is connected to a gate of a transistor T7, the low voltage line $V_{GL}$ is connected to an input terminal of the transistor T7, and the node N2 is connected to an output terminal of the transistor T7. At a start time of the period P2, the transistor T7 turns on, the transistor T7 outputs the low voltage of the low voltage line $V_{GL}$ to the node N2, and the node N2 changes from the high voltage to the low voltage. Hence, the transistors T2 and T6 turn off.

The node N1 is connected to a gate of a transistor T4, the low voltage line $V_{GL}$ is connected to an input terminal of the transistor T4, and the node N2 is connected to an output terminal of the transistor T4. Since the node N1 becomes high voltage in the period P2, the transistor T4 becomes in the on state, and outputs the low voltage of the low voltage line $V_{GL}$ to the node N2. Hence, in a period when the node N1 is high voltage, that is, in the periods P2 to P4, the transistor T4 is maintained in the on state, and the node N2 is maintained at the low voltage.

In the period P3 that is signal high period, the node N1 is maintained at the high voltage, and the transistor T5 is maintained in the on state. The basic clock signal $V_n$ becomes high voltage in the period P3. Hence, in the period P3, the high voltage of the basic clock signal $V_n$ is output from the output terminal OUT through the transistor T5 as the gate signal $G_n$.

In this example, because the threshold voltage $V_{th}$ is actually present in the transistor T1, the node N1 becomes a voltage obtained by subtracting the threshold voltage $V_{th}$ of the transistor T1 from the high voltage of the gate signal $G_{n-2}$ in the period P2. In this voltage, there is a possibility that the transistor T5 cannot sufficiently turn on in the period P3 which is the signal high period. Therefore, the boost capacitor C1 is arranged to connect the gate of the transistor T5 and the output terminal in the gate signal line high voltage supply circuit 12. When it comes to the period P3, the gate signal Gn−2 changes to the low voltage, and the transistor T1 turns off. However, the node N1 is maintained at the high voltage, and the transistor T5 is maintained in the on state. In the period P3, the high voltage of the basic clock signal $V_n$ is applied to the output terminal OUT, and the node N1 is boosted to a higher voltage by a capacitive coupling of the boost capacitor C1. This voltage is called "bootstrap voltage".

Also, in the period P3 and the previous periods illustrated in FIG. 5, the node N3 is maintained at the low voltage. The gate signal $G_{n+2}$ of the (n+2)-th basic circuit 113-(n+2) starts the signal high period after one clock (start of the period P4) from a start of the signal high period (start of the period P3) of the gate signal $G_n$. Also, as illustrated in FIG. 5, the node $N1_{n+2}$ becomes high voltage in the periods P3 to P5. The node $N1_{n+2}$ is connected to the gate of the transistor T5B, and the transistor T5B becomes in the on state in the periods P3 to P5, and outputs the voltage of the basic clock signal $V_{n+2}$ to the node N3.

At an end time of the period P3, the basic clock signal $V_n$ changes from the high voltage to the low voltage. In this situation, as described above, the node N1 is maintained at the high voltage, and the node N2 is maintained at the low voltage. That is, the transistor T5 is in the on state, and the transistor T6 is in the off state. In this embodiment, the node $N1_{n+2}$ is connected to the gate of transistor T5B, and as illustrated in FIG. 5, the node $N1_{n+2}$ becomes high voltage in the periods P3 to P5, and in the periods, the transistor T5B becomes in the on state, and the transistor T5B outputs the voltage of the basic clock signal $V_{n+2}$ to the node N3. At a start time of the period P4, the basic clock signal $V_{n+2}$ changes from the low voltage to the high voltage, and the node N3 changes from the low voltage to the high voltage. Hence, the transistor T5A turns on at the start time of the period P4, and outputs the low voltage of the low voltage line $V_{GL}$ to the output terminal OUT.

As illustrated in FIG. 5, the node $N1_{n+2}$ is boosted to the bootstrap voltage in the period P4. Hence, the node $N1_{n+2}$ in the period P4 becomes a voltage higher than a sum of the threshold voltage $V_{th}$ of the transistor T5B and the high voltage of the basic clock signal $V_{n+2}$, and the transistor T5B becomes sufficiently in the on state in the period P4. For that reason, the node N3 steeply changes from the low voltage to the high voltage, and the high voltage at the node N3 can reach substantially the same voltage as the high voltage of the basic clock signal $V_{n+2}$. Hence, the low voltage can be more stably applied to the corresponding gate signal line 105 at the start time of the period P4 than a case in which the transistor T5A turns on according to a gate signal in a subsequent stage, as disclosed in JP 2011-85663 A.

Also, in the period P5, the transistor T5B becomes in the on state, and the transistor T5B outputs the basic clock signal $V_{n+2}$ to the node N3, but the basic clock signal $V_{n+2}$ becomes low voltage. Therefore, the node N3 becomes low voltage in the period P5. In this embodiment, the basic clock signal $V_{n+4}$ is input to the gate of the transistor T5C, the basic clock signal $V_{n+4}$ becomes high voltage in the period P5, and the transistor T5C becomes in the on state. Hence, in the period P5, the transistor T5C outputs the low voltage of the low voltage line $V_{GL}$ to the node N3. Then, even after the period P6, the basic clock signal $V_{n+4}$ cyclically becomes high voltage, and the transistor T5C becomes cyclically in the on state, and outputs the low voltage of the low voltage line $V_{GL}$ to the node N3. Hence, since the node N3 is held at the low voltage over the signal low period, the threshold voltage $V_{th}$ of the transistor T5A is inhibited from being shifted to the positive side. Hence, at timing when the gate signal $G_n$ changes from the high voltage to the low voltage, the transistor T5A can stably turn on, and output the low voltage to the output terminal OUT.

As illustrated in FIG. 4, the input terminal IN4 is connected to a gate of a transistor T9, the low voltage line $V_{GL}$ is connected to an input terminal of the transistor T9, and the node N1 is connected to an output terminal of the transistor T9. The gate signal $G_{n+4}$ output by the (n+4)-th basic circuit 113-(n+4) is input to the input terminal IN4. Since the gate signal $G_{n+4}$ becomes high voltage in the period P5 illustrated in FIG. 5, the transistor T9 turns on, outputs the low voltage of the low voltage line $V_{GL}$ to the node N1, and the node N1 changes from the high voltage to the low voltage, at a start time of the period P5. With the above operation, the transistor T5 turns off. At the same time, the transistor T4 also turns off.

As illustrated in FIG. 4, the input terminal IN2 is connected to a gate and an input terminal of a transistor T3 (diode connection), and the node N2 is connected to an output terminal of the transistor T3. The basic clock signal $V_{b+4}$ is input to the input terminal IN2. Since the basic clock signal $V_{n+4}$ becomes high voltage in the period P5 illustrated in FIG. 5, the transistor T3 turns on, the transistor T3 outputs the high voltage to the node N2, and the node N2 changes from the low voltage to the high voltage, at a start time of the period P5. Since the node N2 becomes high voltage, the transistors T2 and T6 turn on. Also, a retentive capacitor C3 is arranged to connect the node N2 and the low voltage line $V_{GL}$, and the retentive capacitor C3 is charged at the high voltage in the period P5.

Thereafter, even after the basic clock signal $V_{n+4}$ becomes low voltage in the period P6, and the transistor T3 turns off, the node N2 is maintained at the high voltage by the retentive capacitor C3. Further, since the basic clock signal $V_{n+4}$ cyclically becomes high voltage to continue to cyclically charge the retentive capacitor C3, the node N2 is maintained at the high voltage, and the transistors T2 and T6 are maintained in the on state. The transistor T6 outputs the low voltage of the low voltage line $V_{GL}$ to the output terminal OUT, and holds the voltage of the corresponding gate signal line 105 at the low voltage. The transistor T2 outputs the low voltage of the low voltage line $V_{GL}$ to the node N1, and holds the voltage of the corresponding gate signal line 105 at the low voltage.

Figure 6:
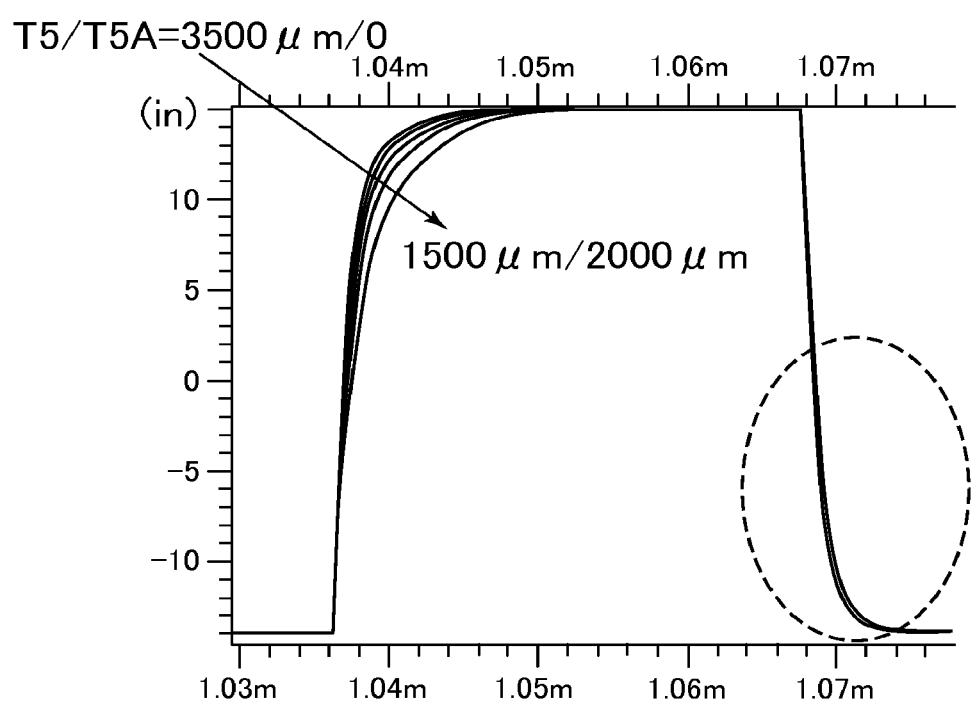
FIG. 6 is a diagram illustrating a signal waveform of a gate signal according to the first embodiment of the present invention.

FIG. 6 is a diagram illustrating a signal waveform of a gate signal according to this embodiment. FIG. 6 illustrates signal waveforms of the gate signal $G_n$ output by the n-th basic circuit 113-$n$ according to this embodiment illustrated in FIG. 4. FIG. 6 illustrates the signal waveforms when a channel width of the transistor T5 decreases from 3500 μm to 1500 μm at the intervals of 500 μm whereas a channel width of the transistor T5A increases from 0 to 2000 μm at the intervals of 500 μm. As with the rising waveform of the gate signal illustrated in FIG. 17, the rising waveform of the gate signal $G_n$ increases the blunting of the signal waveforms with a reduction in the channel width of the transistor T5. However, even when the channel width of the transistor T5 is set to 1500 μm, the signal high period of the gate signal $G_n$ is two horizontal scanning periods (2H periods), and in one horizontal scanning period (1H period) of a second half, pixels are written in the pixel circuits connected to the corresponding gate signal line 105. With the above operation, the high voltage of the gate signal $G_n$ rises to a sufficiently saturated state, and the pixel writing is conducted without any problem.

Figure 17:
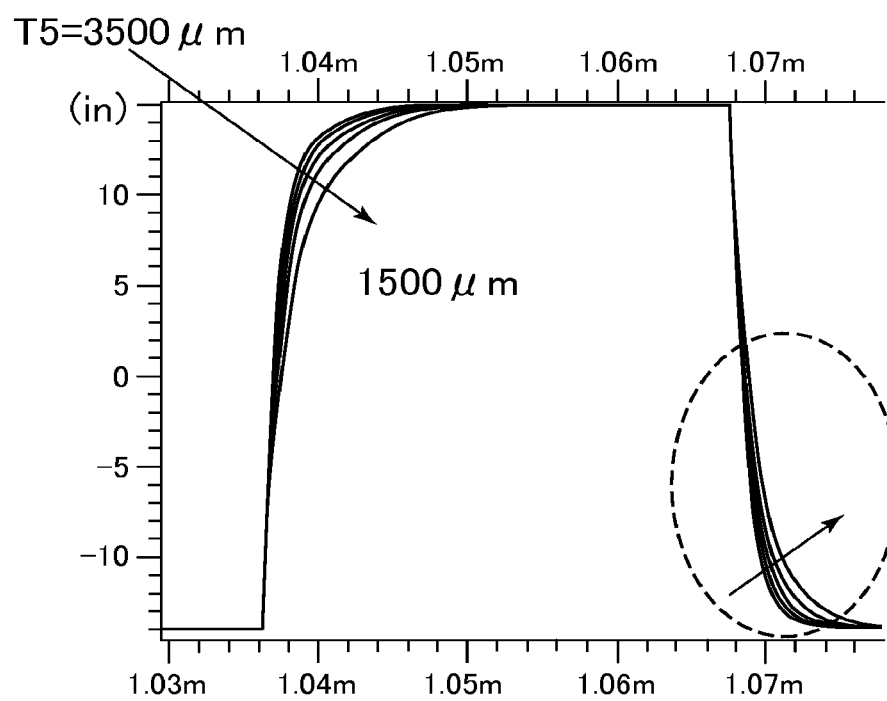
FIG. 17 is a diagram illustrating a signal waveform of a gate signal in the related art.

On the contrary, unlike the falling waveform indicated by the dashed line in FIG. 17, in a falling waveform of the gate signal $G_n$ indicated by a dashed line in FIG. 6, the blunting of the signal waveform is inhibited from increasing, with the arrangement of the transistor T5A even if the channel width of the transistor T5 is reduced. The channel width of the transistor T5 decreases from 3500 μm to 1500 μm, to thereby reduce the power consumption as described above. On the other hand, the channel width of the transistor T5A is set to 2000 μm, but a charge and discharge current hardly flows in the transistor T5A as described above. Also, the element size of the transistor T5B can be reduced sufficiently for the transistor T5B that is in the on state to charge the parasitic capacitor generated in the node N3 in a short time. In this embodiment, the transistor T5B can be designed so that the parasitic capacitance of the node N3 is 0.8 pF, the channel width of the transistor T5B is 100 μm, and the channel length is 4 μm. Hence, the power consumption in the transistor T5B can be reduced.

Figure 16:
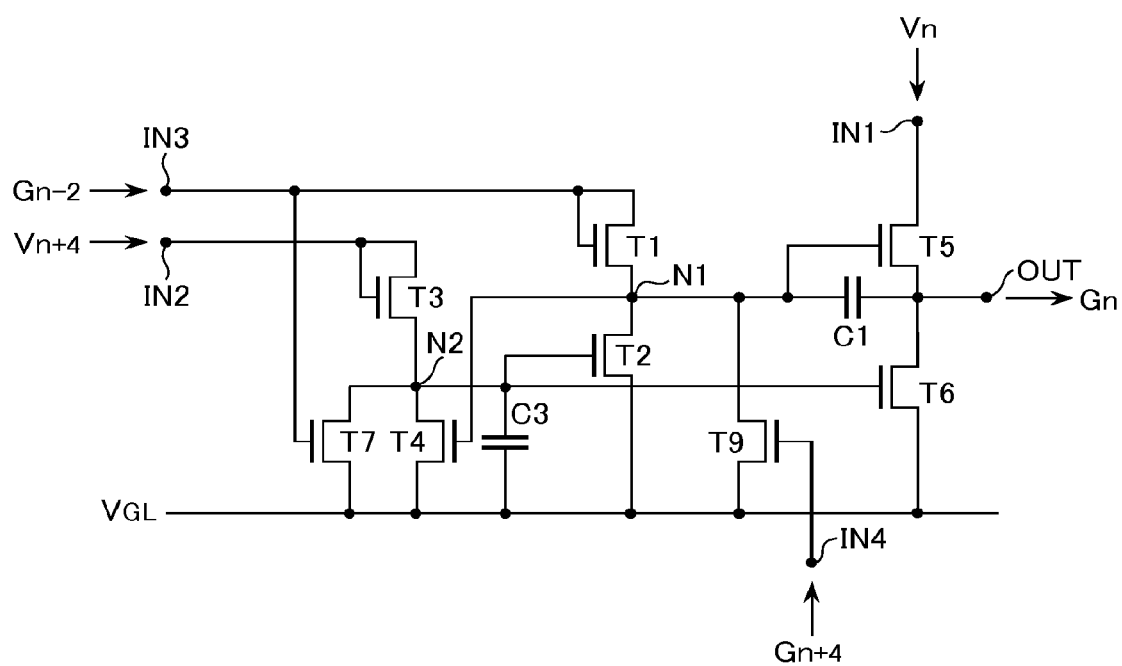
FIG. 16 is a circuit diagram of a basic circuit of a shift register circuit in a related art.

The power consumption of the basic circuits 113 according to this embodiment is represented in the following Table 1 as compared with the basic circuits according to the related art illustrated in FIG. 16. Table 1 represents the basic circuit (related art circuit) according to the related art in which the channel width of the transistor T5 is set to 3500 μm (the transistor T5A is not arranged), and the basic circuit (circuit in the first embodiment) according to this embodiment in which the channel width of the transistor T5 is set to 1500 μm, and the channel width of the transistor T5A is set to 2000 μm. As illustrated in FIGS. 6 and 17, in those two circuits compared with each other, the falling waveforms of the gate signal $G_n$ are substantially identical with each other, and steeply change from the high voltage to the low voltage together. Nevertheless, the power consumption of the basic circuit according to this embodiment is 30 mW, that is, can be reduced to about ⅔ of the power consumption, compared with the power consumption of 44 mW of the basic circuit in the related art.

TABLE 1

| | Circuit in Related Art | Circuit in Embodiment 1 |
|---|---|---|
| Power Consumption | 44 mW | 30 mW |
| T5 Channel Width | 3500 μm | 1500 μm |
| T5A Channel Width | None | 2000 μm |

The basic clock signal input to the gate signal line drive circuit according to this embodiment are 4-phase clock signals, but not limited to this type, and may be m-phase (m is an integer equal to or higher than 3) clock signals. The m-phase clock signals repeat m clocks as one cycle. In this embodiment, the basic clock signal $V_{n|4}$ (third basic clock signal) that changes from the low voltage to the high voltage at timing when the basic clock signal $V_{n+2}$ (second basic clock signal) output by the transistor T5B changes from the high voltage to the low voltage is input to the gate of the transistor T5C. The transistor T5C turns on at the start time of the period P5, and the transistor T5C outputs the low voltage of the low voltage line $V_{GL}$ to the node N3. With the above operation, the node N3 can steeply change from the high voltage to the low voltage at the start time of the period P5 while reducing a load exerted on the transistor T5B. It is desirable that the basic clock signal $V_{n+4}$ is input to the gate of the transistor T5C, but the present invention is not limited to this configuration. The transistor T5C that is the first low voltage application off control element may be configured by any element that turns on after the transistor T5B, which is the first low voltage application on control element, outputs the high voltage of the second basic clock signal to the node N3, and outputs the low voltage to the node N3. The basic clock signal may be another basic clock signal (for example, basic clock signal $V_{n+6}$) that becomes high voltage in a period since the second basic clock signal changes from the high voltage to the low voltage until the second basic clock signal then changes to the high voltage. Also, the basic clock signal cyclically becomes high voltage, and the transistor T5C cyclically becomes in the on state, and outputs the low voltage of the low voltage line $V_{GL}$ to the node N3, and the node N3 is stably maintained at the low voltage over the signal low period, which is therefore desirable. However, the signal input to the gate of the transistor T5C is not limited to the basic clock signal, but may be, for example, another gate signal (for example, gate signal $G_{n+4}$). In particular, since the gate signal $G_{n+4}$ output by the (n+4)-th basic circuit 113-($n$+4) becomes high voltage in the period P5, the load exerted on the transistor T5B can be reduced, which is therefore desirable.

Second Embodiment

An n-th basic circuit 113-$n$ according to a second embodiment of the present invention is different from that of the first embodiment in that a signal input to the gate of the transistor T5B, which is the first low voltage application on control element, is input from a node $N1_{n+1}$ of an (n+1)-th basic circuit 113-($n$+1). Also, a gate signal line low voltage supply circuit 14$_n$ provided in the n-th basic circuit 113-$n$ is arranged on a side of the display area 120 opposite to the main circuit of the n-th basic circuit 113-$n$. The other structures of the gate signal line drive circuit 104 according to this embodiment are identical with those of the first embodiment.

Figure 7:
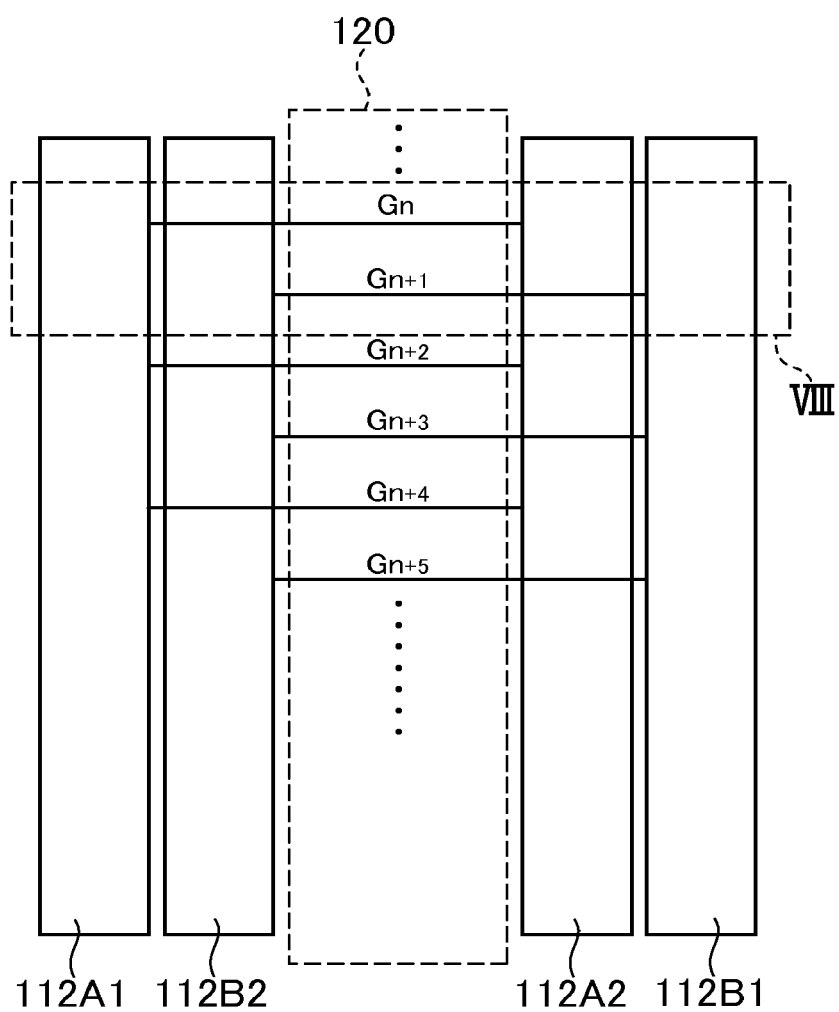
FIG. 7 is a schematic diagram illustrating a configuration of a gate signal line drive circuit according to a second embodiment of the present invention.

FIG. 7 is a schematic diagram illustrating a configuration of a gate signal line drive circuit 104 according to this embodiment. The gate signal line drive circuit 104 according to this embodiment includes an even shift register circuit 112A that outputs gate signals to respective even-numbered gate signal lines 105 (400 lines), and an odd shift register circuit 112B that outputs gate signals to respective odd-numbered gate signal lines 105 (400 lines). The even shift register circuit 112A includes 400 even basic circuits, and the odd shift register circuit 112B includes 400 odd basic circuits. The even shift register circuit 112A includes an even shift register main circuit portion 112A1 having main circuits of the even basic circuits, and an even shift register sub-circuit portion 112A2 having a gate signal line low voltage supply circuit 14 of the even basic circuits. The odd shift register circuit 112B includes an odd shift register main circuit portion 112B1 having main circuits of the odd basic circuits, and an odd shift register sub-circuit portion 112B2 having a gate signal line low voltage supply circuit 14 of the odd basic circuits. As illustrated in FIG. 7, the odd shift register sub-circuit portion 112B2 and the even shift register main circuit portion 112A1 are arranged on a left side of the display area 120 in order, and the even shift register sub-circuit portion 112A2 and the odd shift register main circuit portion 112B1 are arranged on a right side of the display area 120 in order.

Figure 8:
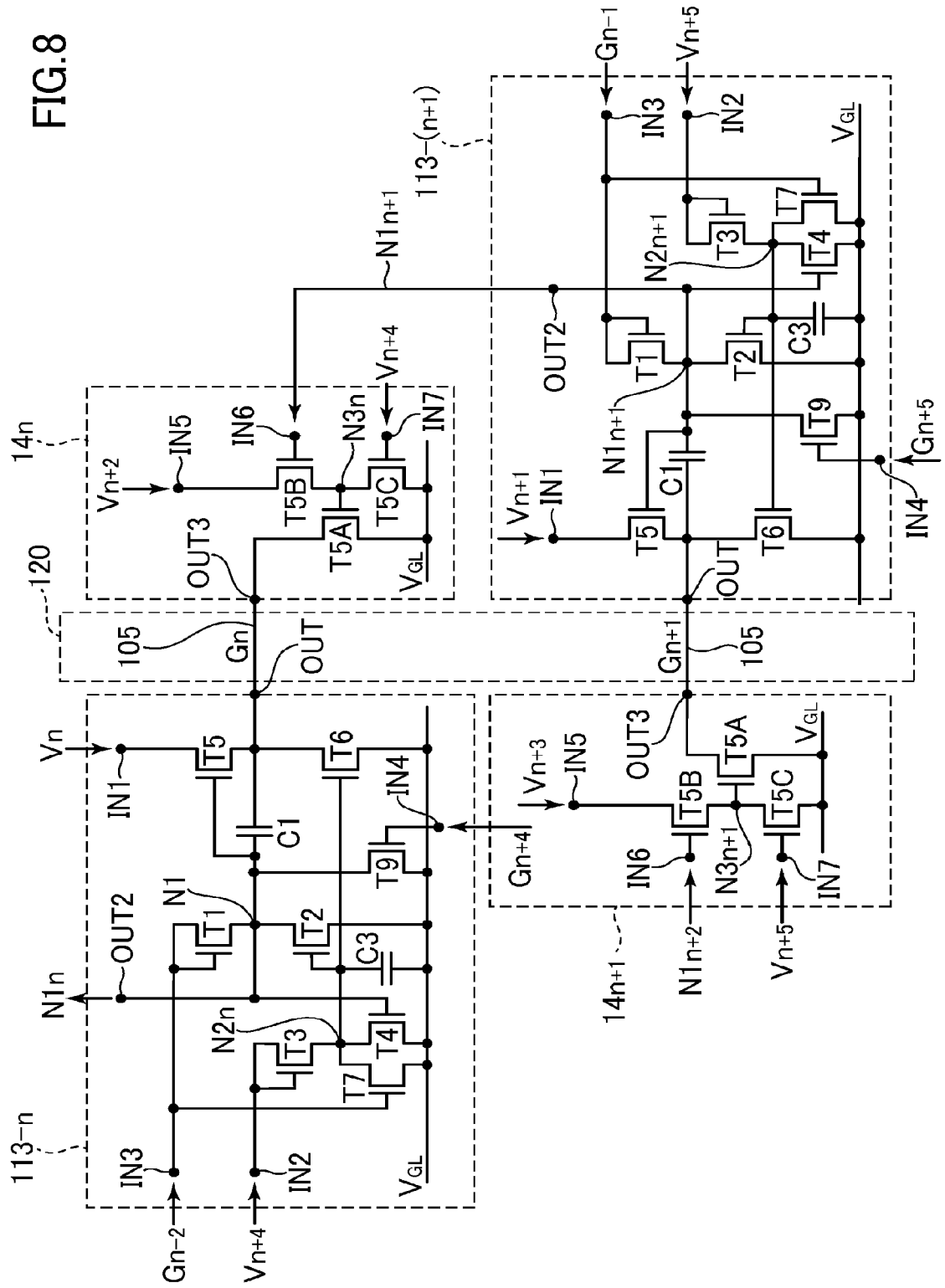
FIG. 8 is a circuit diagram illustrating a basic circuit according to the second embodiment of the present invention.

FIG. 8 is a circuit diagram illustrating a basic circuit 113 according to this embodiment. FIG. 8 schematically illustrates an area VIII indicated by a dashed line of FIG. 7. An upper stage of FIG. 8 illustrates an n-th basic circuit 113-$n$, and a lower stage of FIG. 8 illustrates an (n+1)-th basic circuit 113-($n$+1). As described above, the main circuit of the n-th basic circuit 113-$n$ is arranged on the left side of the display area 120, and indicated as 113-$n$ in FIG. 8. The gate signal line low voltage supply circuit 14 of the n-th basic circuit 113-$n$ is arranged on the right side of the display area 120, and indicated as 14$_n$ in FIG. 8. The (n+1)-th basic circuit 113-($n$+1) is reversed in arrangement, but identical in the other configurations with the n-th basic circuit 113-$n$.

The n-th basic circuit 113-$n$ according to this embodiment is different from that in the first embodiment in that the gate signal line low voltage supply circuit 14$_n$ is arranged on an opposite side of the display area 120, the gate signal line low voltage supply circuit 14$_n$ further includes an output terminal OUT3, and the output terminal OUT3 is connected to the output terminal of the transistor T5A. As illustrated in FIG. 8, the output terminal OUT5 is connected to the corresponding gate signal line 105. Also, as described above, the input terminal IN6 connected to the gate of the transistor T5B is connected with the node N1$_{n+1}$ of the (n+1)-th basic circuit 113-($n$+1). Also, with the above arrangement of the gate signal line low voltage supply circuit 14$_n$, a line that connects the gate of the transistor T5B and the node N1$_{n+1}$ can be shortened.

Figure 9:
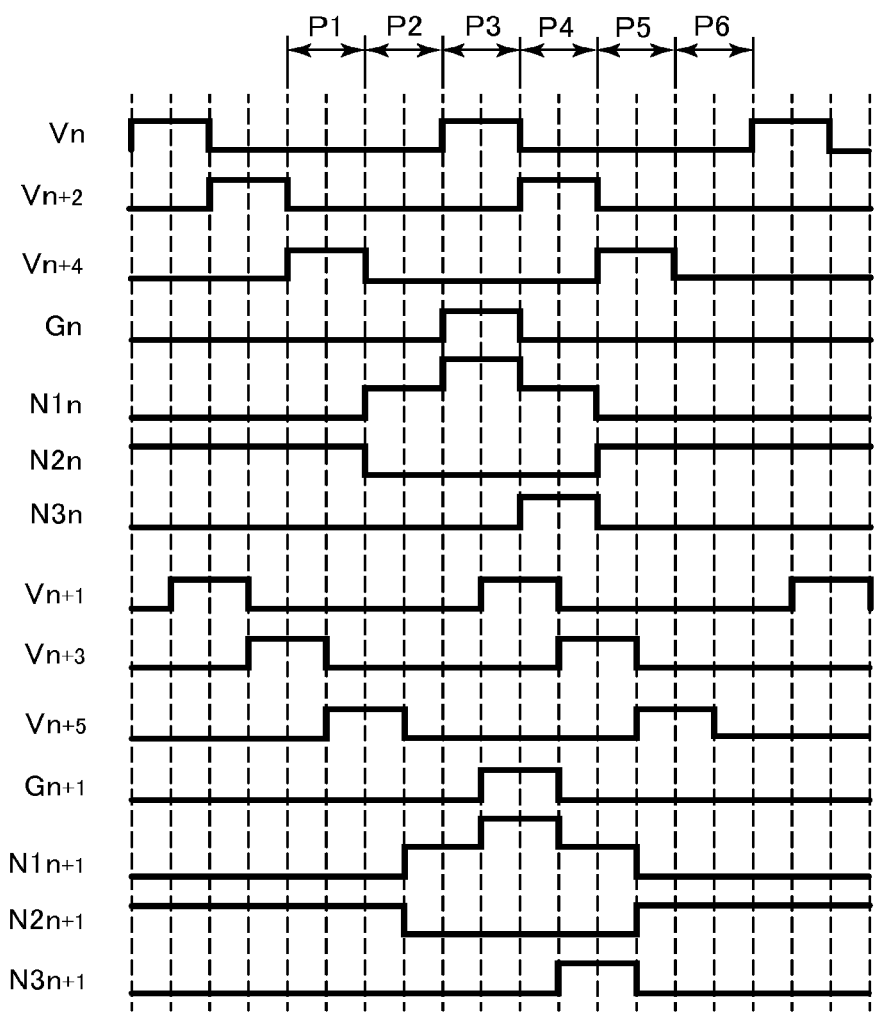
FIG. 9 is a timing chart representing drive operation of the gate signal line drive circuit according to the second embodiment of the present invention.

FIG. 9 is a timing chart representing drive operation of the gate signal line drive circuit 104 according to this embodiment, and illustrates changes of the basic clock signals V$_n$, V$_{n+2}$, V$_{n+4}$, the gate signal G$_n$, the nodes N1$_n$, N2$_n$, Na$_n$, the basic clock signals V$_{n+1}$, V$_{n+3}$, V$_{n+5}$, the gate signal G$_{n+1}$, and the nodes N1$_{n+1}$, N2$_{n+1}$, N3$_{n+1}$ in time. As illustrated in FIG. 9, the gate signal G$_{n+1}$ output by the (n+1)-th basic circuit 113-($n$+1) is a gate signal that changes to the high voltage later than the gate signal G$_n$ output by the n-th basic circuit 113-$n$ by half clock. The node N1$_{n+1}$ becomes high voltage from a center of the period P2 to a center of the period P5. Hence, the transistor T5B according to this embodiment becomes in the on state in the above period. A time at which the period P4 starts is timing when the basic clock signal V$_{n+2}$ input to the input terminal of the transistor T5B changes from the low voltage to the high voltage, and the time is a center of a period (from a center of the period P3 to a center of the period P4) during which the node becomes a bootstrap voltage that is boosted by a capacitive coupling of the boost capacitor C1.

It is desirable that the transistor T5B become sufficiently in the on state, and the voltage of the basic clock signal V$_{n+2}$ is output to the node N3, at the start time of the period P4. The gate of the transistor T5B according to the first embodiment is connected with the node N1$_{n+2}$ of the (n+2)-th basic circuit 113-($n$+2), and the start time of the period P4 is a start of a period during which the voltage of the node N1$_{n+2}$ becomes the bootstrap voltage. However, in fact, it takes a finite time to change from a normal high voltage to a bootstrap voltage by the capacitive coupling of the boost capacitor C1, and the node N1$_{n+2}$ is not yet sufficiently boosted to the bootstrap voltage at the start time of the period P4. On the contrary, the node N1$_{n+1}$ connected to the gate of the transistor T5B according to this embodiment is sufficiently boosted to the bootstrap voltage at the start time of the period P4, and the node N1$_{n+1}$ is higher than a sum of the threshold voltage V$_{th}$ of the transistor T5B and the high voltage of the basic clock signal V$_{n+2}$ The transistor T5B is sufficiently in the on state at the start time of the period P4. Hence, as compared with the first embodiment, the node N3 steeply changes from the low voltage to the high voltage, and the high voltage at the node N3 can arrive at substantially the same voltage as the high voltage of the basic clock signal V$_{n+2}$ Hence, at the start time of the period P4, the transistor T5A can more stably supply the low voltage to the corresponding gate signal line 105, and can more suppress the blunting of the falling waveform of the gate signal G$_n$ output from the output terminal OUT.

In this example, it is assumed that the n-th basic circuit 113-$n$ is a first basic circuit. In the first embodiment, when it is assumed that the (n+2)-th basic circuit 113-($n$+2) is a second basic circuit, the signal high period of the second basic circuit starts at a time (start of the period P4 illustrated in FIG. 5) later than the start (start of the period P3 illustrated in FIG. 5) of the signal high period of the first basic circuit by one clock. On the other hand, in the second embodiment, when it is assumed that the (n+1)-th basic circuit 113-($n$+1) is the second basic circuit, the signal high period of the second basic circuit starts at a time (center of the period P3 illustrated in FIG. 9) later than the start (start of the period P3 illustrated in FIG. 9) of the signal high period of the first basic circuit by half clock. In the first and second embodiments, the node N1 of the second basic circuit is connected to the gate (control terminal) of the transistor T5B (the first low voltage application on control element) of the first basic circuit. In this way, since the node N1 is sufficiently high voltage in the signal high period of the basic circuit in the second basic circuit, it is desirable that assuming that the basic circuit in which the signal high period of the gate signal starts within one clock after the start of the signal high period (the period P3 indicated in FIGS. 5 and 9) of the first basic circuit (the gate signal G$_n$) is the second basic circuit, the node N1 of the second basic circuit is connected to the gate of the transistor T5B. The transistor T5B is sufficiently in the on state at a time (the start time of the period P4 indicated in FIGS. 5 and 9) when the basic clock signal V$_{n+2}$ input to the transistor T5B of the first basic circuit changes from the low voltage to the high voltage, and the node N3 can steeply change from the low voltage to the high voltage. In the gate signal line drive circuit according to the first and second embodiments, the basic clock signal having 2H periods as one clock is used. However, the present invention is not limited to this configuration, and may use a basic clock signal having a larger number of horizontal scanning periods (for example, 4H periods) as one clock. When the larger number of horizontal scanning periods is set as one clock, there are present the larger number of basic circuits in which the signal high period of the gate signal starts within one clock after the start of the signal high period of the first basic circuit (the gate signal $G_n$). For that reason, an appropriate basic circuit can be selected as the second basic circuit from the above basic circuits can be connected to the node N1 of the second basic circuit, and the gate of the transistor T5B of the n-th basic circuit 113-n. In this example, the n-th basic circuit 113-n has been described as the first basic circuit. Alternatively, the respective basic circuits may be set as the first basic circuits, and a basic circuit suitable for the first basic circuits may be set as the second basic circuit without depending on the specific value of n.

Third Embodiment

A gate signal line drive circuit 104 according to a third embodiment of the present invention is different in the configuration of the basic circuits 113 from that of the first or second embodiment, and also different in the basic clock signal to be input from that of the first or second embodiment. On the other hand, the other structures are identical with those of the first or second embodiment.

Figure 10:
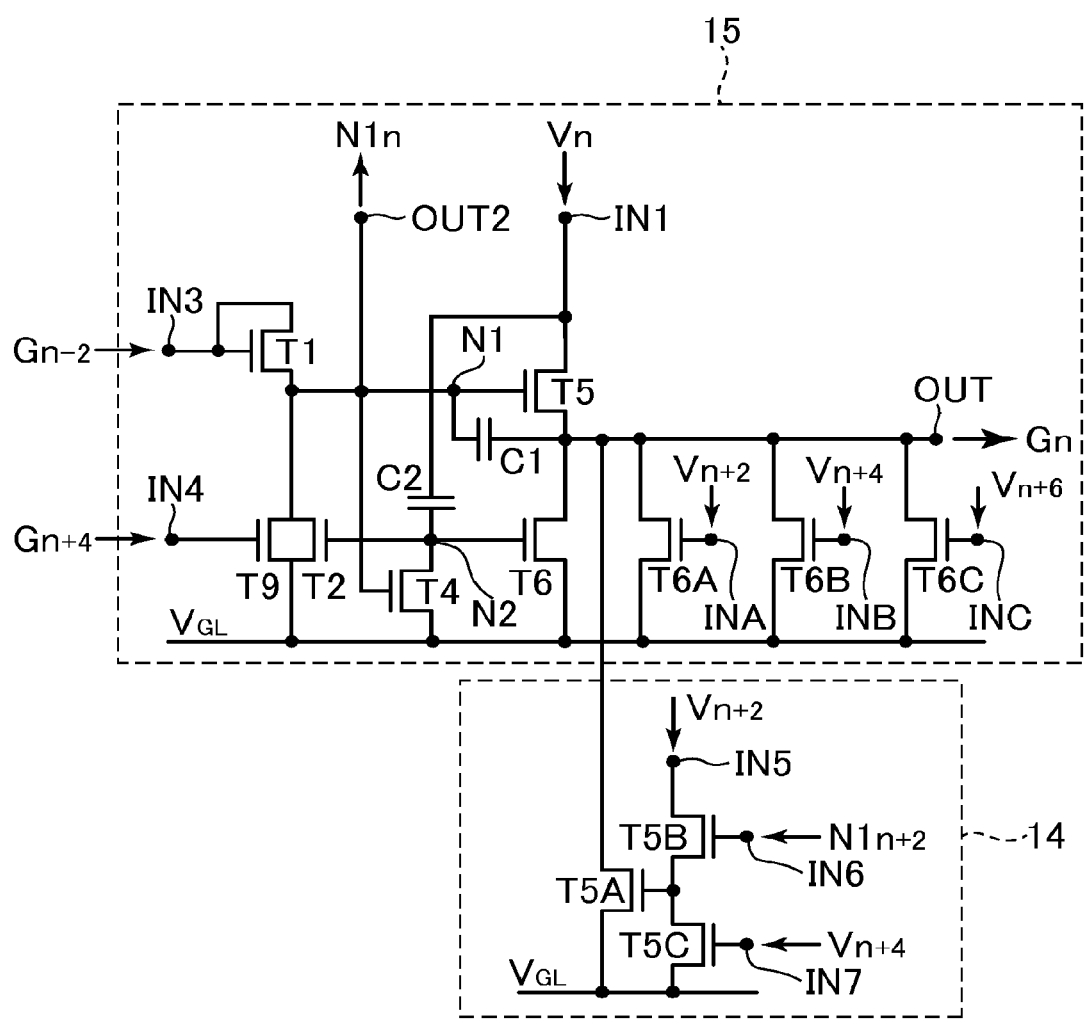
FIG. 10 is a circuit diagram of an n-th basic circuit according to a third embodiment of the present invention.

FIG. 10 is a circuit diagram of an n-th basic circuit 113-n according to this embodiment. The n-th basic circuit 113-n according to this embodiment includes a main circuit portion 15, and a gate signal line low voltage supply circuit 14.

First, the main circuit portion 15 of the n-th basic circuit 113-n will be described. The n-th basic circuit 113-n according to this embodiment is different from the n-th basic circuit 113-n according to the first embodiment illustrated in FIG. 4 in that the input terminal IN2, the transistors T3, T7, and the retentive capacitor C3 are not provided. Instead, the n-th basic circuit 113-n further includes input terminals INA, INB, and INC, and basic clock signals $V_{n+2}$, $V_{n+4}$, and $V_{n+6}$ are input to the input terminals INA, INB, and INC, respectively. Also, the n-th basic circuit 113-n further includes transistors T6A, T6B, T6C, and a buffer capacitor C2. The buffer capacitor C2 is connected between the input terminal IN1 and the node N2. All of input terminals of the transistors T6A, T6B, and T6C are connected to the low voltage line $V_{GL}$, and all of output terminals of the transistors T6A, T6B, and T6C are connected to the output terminal OUT. Gates of the transistors T6A, T6B, and T6C are connected to the input terminals INA, INB, and INC, respectively.

Figure 11:
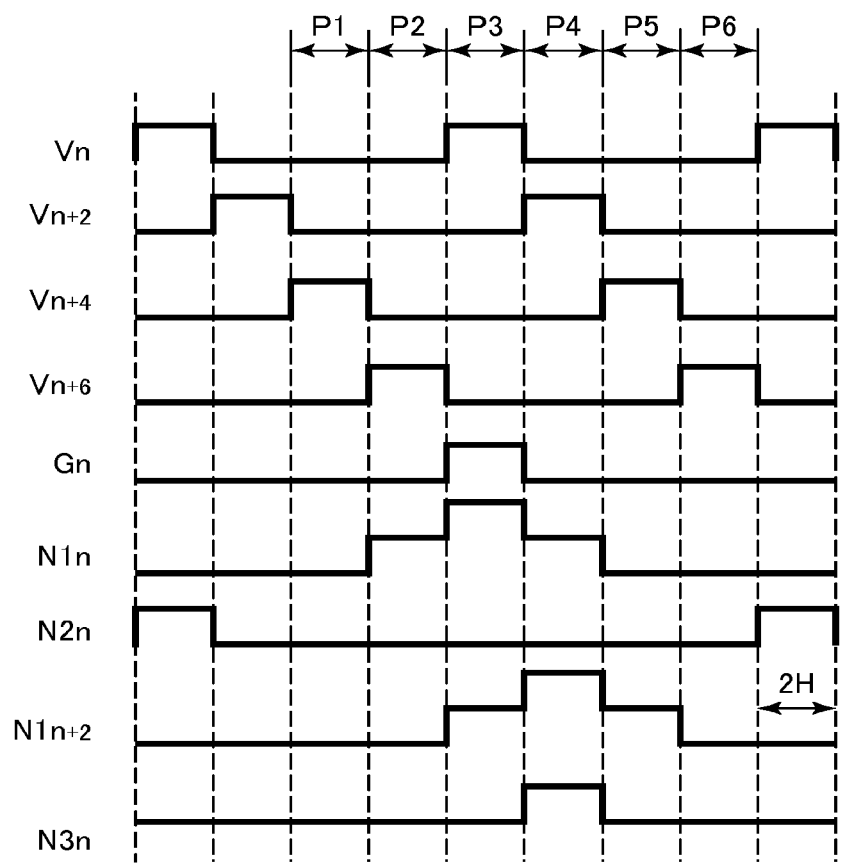
FIG. 11 is a timing chart representing drive operation of a gate signal line drive circuit according to the third embodiment of the present invention.

FIG. 11 is a timing chart representing drive operation of the gate signal line drive circuit 104 according to this embodiment. FIG. 11 illustrates changes of the basic clock signals $V_n$, $V_{n+2}$, $V_{n+4}$, $V_{n+6}$, the gate signal $G_n$, and the nodes $N1_n$, $N2_n$, $N1_{n+2}$, $N3_n$ in time.

As in the first embodiment, in the period P1 and the previous periods, the node N1 is maintained at the low voltage. At the start time of the period P2, the gate signal $G_{n-2}$ output by the (n−2)-th basic circuit 113-(n−2) changes from the low voltage to the high voltage, and the node N1 changes from the low voltage to the high voltage. At the start time of the period P5, the gate signal $G_{n|4}$ output by the (n+4)-th basic circuit 113-(n+4) changes from the low voltage to the high voltage, and the node N1 changes from the high voltage to the low voltage. Hence, as in the first embodiment, the node N1 is at high voltage in the periods P2 to P4, and the transistor T5 is in the on state in those periods. The transistor T5 outputs the voltage of the basic clock signal $V_n$ to the output terminal OUT (corresponding gate signal line 105). In the period P3 (signal high period), the basic clock signal $V_n$ becomes high voltage, and the gate signal $G_n$ output from the output terminal OUT becomes high voltage.

In the periods P2 to P4, since the node N1 becomes high voltage, the transistor T4 becomes in the on state, and outputs the low voltage of the low voltage line $V_{GL}$ to the node N2. Hence, the node N2 is maintained at the low voltage, and the transistors T2 and T6 become in the off state. In the period P3, the basic clock signal $V_n$ input to the input terminal IN1 becomes high voltage, but the node N2 is maintained at the low voltage by charging the buffer capacitor C2. In the period P5, the node N1 becomes low voltage, and the transistor T4 becomes in the off state. Thereafter, the node N2 rises through the buffer capacitor C2 according to the basic clock signal $V_n$ that becomes cyclically high voltage, and becomes high voltage. The node N2 becomes high voltage, as a result of which the transistors T2 and T6 become in the on state, the transistor T2 outputs the low voltage of the low voltage line $V_{GL}$ to the node N1, and the transistor T6 outputs the low voltage of the low voltage line $V_{GL}$ to the output terminal OUT (corresponding gate signal line 105).

In addition to the transistor T6, the transistors T6A, T6B, and T6C become in the on state when the basic clock signals $V_{n+2}$, $V_{n+4}$, and $V_{n+6}$ become high voltage, and output the low voltage of the low voltage line $V_{GL}$ to the output terminal OUT (corresponding gate signal line 105). Hence, the gate signal $G_n$ is stably maintained at the low voltage over the signal low period.

At the start time of the period P4 (at timing when the gate signal $G_n$ changes from the high voltage to the low voltage), the transistor T6A turns on, and outputs the low voltage of the low voltage line $V_{GL}$ to the output terminal OUT (corresponding gate signal line 105). However, as described above, because the transistor T6A is cyclically in the on state, the threshold voltage $V_{th}$ of the transistor T6A is shifted to the positive side, and at the timing when the gate signal $G_n$ changes from the high voltage to the low voltage, the transistor T6A does not stably turn on, and the transistor T6A cannot sufficiently output the low voltage to the output terminal OUT.

Subsequently, a description will be given of the gate signal line low voltage supply circuit 14 of the n-th basic circuit 113-n. As in the first embodiment, the n-th basic circuit 113-n according to this embodiment includes the gate signal line low voltage supply circuit 14, and at the start time of the period P4, the transistor T5B stably turns on by the node $N1_{n+2}$, and the node N3 steeply changes from the low voltage to the high voltage. As a result, at the start time of the period P4, the transistor T5A stably turns on, and can sufficiently output the low voltage of the low voltage line $V_{GL}$ to the output terminal OUT. That is, the present invention is not limited to the gate signal line drive circuit according to this embodiment, but can be extensively applied to various gate signal line drive circuits.

In this embodiment, the node $N1_{n+2}$ of the (n+2)-th basic circuit 113-(n+2) is connected to the gate of the transistor T5B. However, it is needless to say that the present invention is not limited to this configuration. As in the second embodiment, the node $N1_{n+1}$ of the (n+1)-th basic circuit 113-(n+1) may be connected to the gate of the transistor T5B. Alternatively, the node N1 of the basic circuit in which the signal high period of the gate signal starts within one clock after the start of the signal high period (the period P3) of the gate signal $G_n$ may be connected to the gate of the transistor T5B.

Fourth Embodiment

A gate signal line drive circuit 104 according to a fourth embodiment of the present invention is different in a configuration in which basic circuits 113 are bidirectional from that in the first to third embodiments, and a gate signal and a basic clock signal to be input are different from those in the first to third embodiments. However, the other configurations are identical with those in any one of the first to third embodiments.

Figure 12:
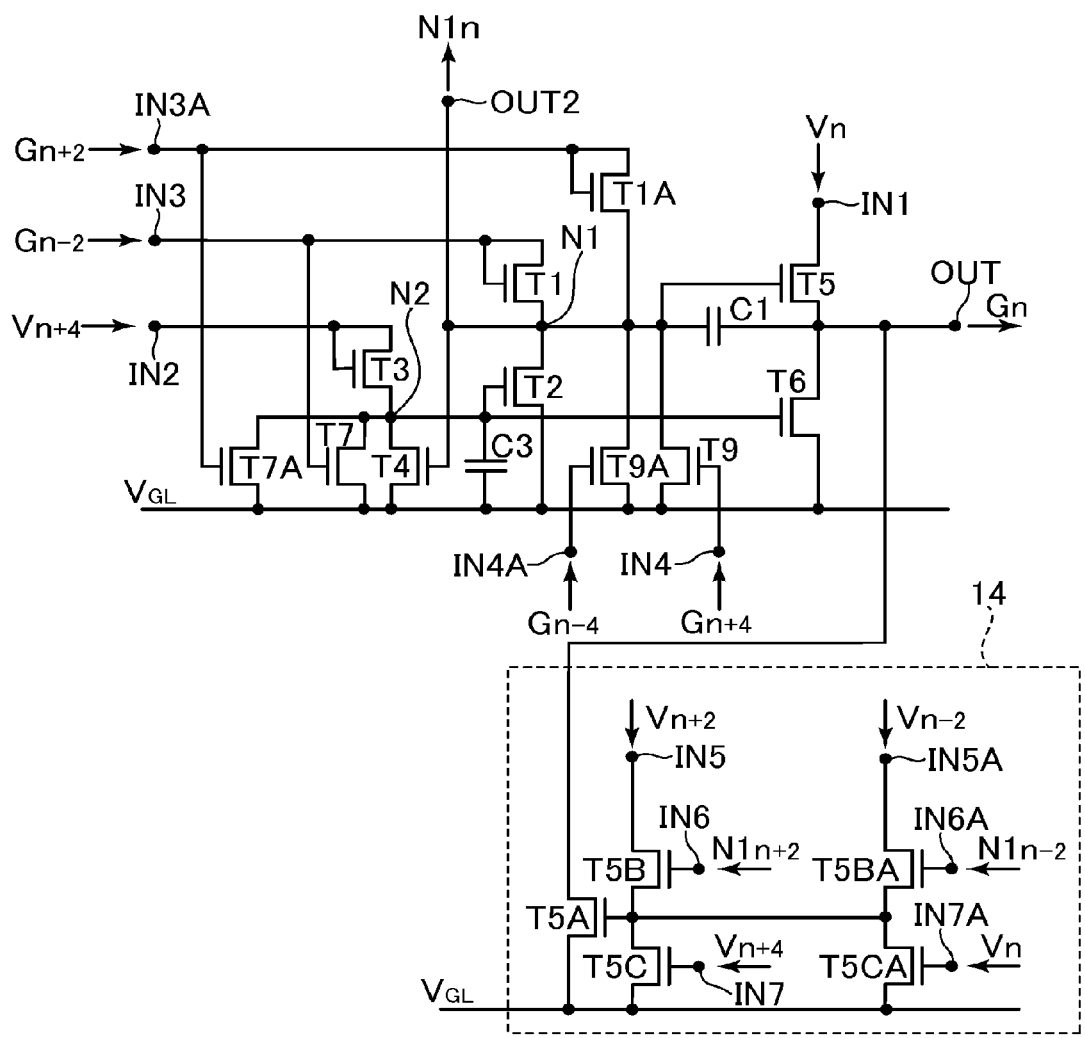
FIG. 12 is a circuit diagram of an n-th basic circuit according to a fourth embodiment of the present invention.

FIG. 12 is a circuit diagram of an n-th basic circuit 113-$n$ according to this embodiment. Unlike the n-th basic circuit 113-$n$ according to the first embodiment illustrated in FIG. 4, an n-th basic circuit 113-$n$ according to this embodiment further includes input terminals IN3A, IN4A, IN5A, IN6A, and IN7A. A gate signal $G_{n|2}$, a gate signal $G_{n-4}$, a basic clock signal $V_{n-2}$ (fourth basic clock signal), a node $N1_{n-2}$, and a basic clock signal $V_n$ (first basic clock signal) are input to the input terminals IN3A, IN4A, IN5A, IN6A, and IN7A, respectively. In this example, the basic clock signal $V_{n-2}$ (fourth basic clock signal) is a clock signal that becomes high voltage in a clock previous to a clock in which the basic clock signal $V_n$ (first basic clock signal) becomes high voltage. Further, the n-th basic circuit 113-$n$ further includes transistors T1A, T5BA, T5CA, T7A, and T9A. The transistors T1A, T7A, and T9A have the same function as that of the transistors T1, T7, and T9 in forward scanning, in reverse scanning, respectively. Also, the transistors T1A, T7A, and T9A do not contribute to a voltage change of the nodes in the forward scanning. On the contrary, the transistors T1, T7, and T9 do not contribute to a voltage change of the nodes in the reverse scanning. The transistor T5BA is a second low voltage application on control element, and the transistor T5CA is a second low voltage application off control element. Both of the transistors T5BA and T5CA are disposed in the gate signal line low voltage supply circuit 14.

The order of increasing a value of "n" of the n-th basic circuit 113-$n$ is the forward order, and scanning in which the gate signals become high voltage in the forward order is the forward scanning. On the contrary, the order of decreasing the value of "n" is opposite to the forward order, and defined as the reverse order, and the scanning in which the gate signals become high voltage in the reverse order is the reverse scanning. In this embodiment, in the forward scanning, as in the first to third embodiments, the basic clock signals $V_{n-2}$, $V_n$, $V_{n|2}$, and $V_{n|4}$ become high voltage in the stated order. However, in the reverse scanning, the basic clock signals $V_{n-2}$, $V_n$, $V_{n+2}$, and $V_{n+4}$ become high voltage in an order reverse to the forward order. That is, the basic clock signals $V_{n+4}$ $V_{n+2}$, $V_n$, and $V_{n-2}$ become high voltage in the stated order. Also, because the input terminal IN3A of an 800$^{th}$ basic circuit 113-800, and the input terminal IN3A of a 799$^{th}$ basic circuit 113-799 have no corresponding gate signals, auxiliary signals $V_{ST1}$ and $V_{ST2}$ are input to those respective input terminals. Also, because the input terminals IN4A of the first basic circuit 113-1 to the fourth basic circuit 113-4 have no gate signals, four dummy circuits are disposed in the respective basic circuits. In the gate signal line drive circuit according to this embodiment, the basic clock signals $V_{n-2}$, $V_n$, $V_{n+2}$, and $V_{n+4}$ become high voltage in the stated order to drive the forward scanning. The basic clock signals $V_{n-2}$, $V_n$, $V_{n+2}$, and $V_{n+4}$ become high voltage in the order reverse to the forward order to drive the reverse scanning. Thus, the bidirectional scanning is enabled.

The input terminal IN5A is connected to an input terminal of the transistor T5BA, the node N3 is connected to an output terminal of the transistor T5BA, and the input terminal IN6A is connected to a gate of the transistor T5BA. Also, the low voltage line $V_{GL}$ is connected to an input terminal of the transistor T5CA, the node N3 is connected to an output terminal of the transistor T5CA, and the input terminal IN7A is connected to a gate of the transistor T5CA. When the node $N1_{n-2}$ of the (n-2)-th basic circuit 113-(n-2) is at high voltage, the transistor T5BA becomes in the on state, and outputs the voltage of the basic clock signal $V_{n-2}$ to the node N3. Also, when the basic clock signal $V_n$ is high voltage, the transistor T5CA becomes in the on state, and outputs the low voltage of the low voltage line $V_{GL}$ to the node N3.

Figure 13:
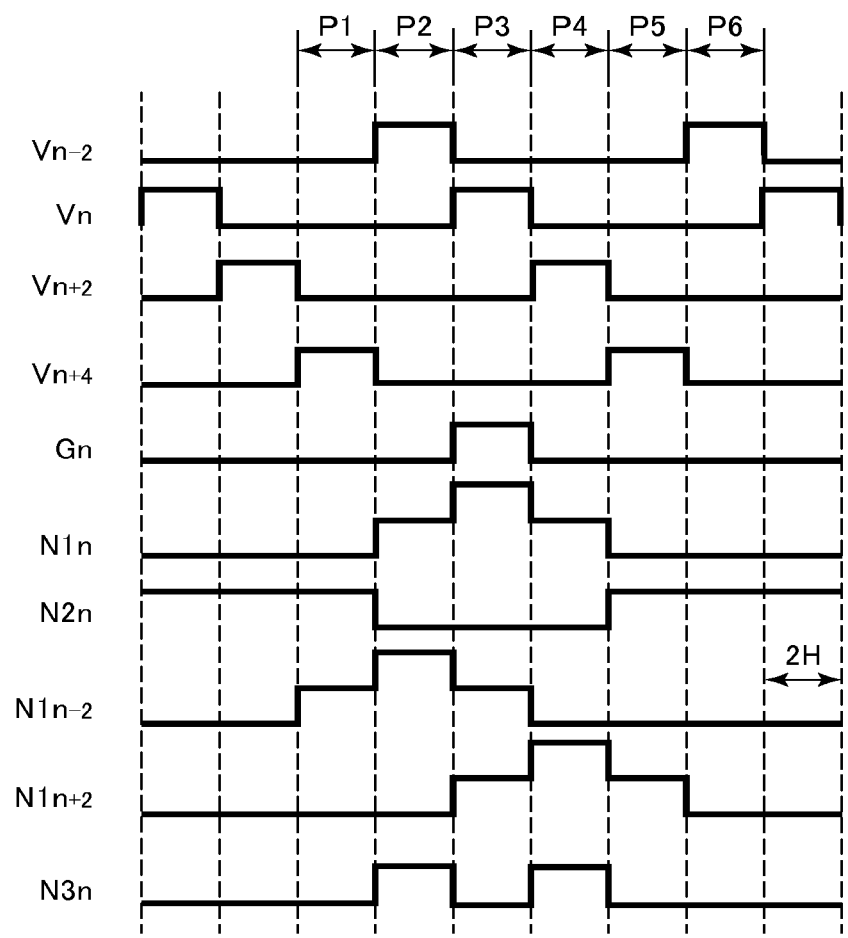
FIG. 13 is a timing chart representing drive operation of a gate signal line drive circuit in forward scanning according to the fourth embodiment of the present invention.

FIG. 13 is a timing chart representing drive operation of the gate signal line drive circuit 104 in the forward scanning according to this embodiment. FIG. 13 illustrates changes of the basic clock signals $V_{n-2}$, $V_n$, $V_{n+2}$, $V_{n+4}$, the gate signal $G_n$, and the nodes $N1_n$, $N2_n$, $N1_{n-2}$, $N1_{n+2}$ $N3_n$ in time. The voltage changes of the nodes N1 and N2 are identical with those in the first embodiment. The node N3 becomes high voltage in the periods P2 to P4, and becomes low voltage in the other periods.

In the period P1 and the previous periods, the node N3 is maintained at the low voltage. The node $N1_{n-2}$ of the (n-2)-th basic circuit 113-(n-2) becomes high voltage in the periods P1 to P3, as illustrated in FIG. 13. The node $N1_{n-2}$ is connected to the gate of the transistor T5BA, and the transistor T5BA becomes in the on state in the periods P1 to P3, and outputs the voltage of the basic clock signal $V_{n-2}$ to the node N3. At the start time of the period P2, the basic clock signal $V_{n-2}$ changes from the low voltage to the high voltage. Hence, at least at timing when the basic clock signal $V_{n-2}$ changes from the low voltage to the high voltage, the transistor T5BA becomes in the on state, and outputs the voltage of the basic clock signal $V_{n-2}$ to the node N3. As illustrated in FIG. 13, the node N3 becomes high voltage, and the transistor T5A becomes in the on state, and outputs the low voltage of the low voltage line $V_{GL}$ to the output terminal OUT (corresponding gate signal line 105). The basic clock signal $V_n$ becomes high voltage in the period P3, and the transistor T5CA becomes in the on state, and outputs the low voltage of the low voltage line $V_{GL}$ to the node N3. The node N3 becomes stably low voltage in the period P3 by the aid of the transistor T5CA. Further, the transistors T5B and T5C are driven in the same manner as that in the first embodiment, as a result of which the node N3 becomes high voltage in the period P4, and becomes low voltage in the period P5 and the subsequent periods. Since the basic clock signal $V_n$ becomes cyclically high voltage, the transistor T5CA becomes cyclically in the on state, and outputs the low voltage of the low voltage line $V_{GL}$ to the node N3, as with the transistor T5C.

In this example, it is assumed that the n-th basic circuit 113-$n$ is a first basic circuit. In this embodiment, when it is assumed that the (n-2)-th basic circuit 113-(n-2) is a third basic circuit, the signal high period of the third basic circuit starts at a time earlier than the start (the start of the period P3) of the signal high period of the first basic circuit (gate signal $G_n$) by one clock (start of the period P2). As with the above second basic circuit, the third basic circuit is not limited to this configuration. A basic circuit is desirable in which the signal high period of the gate signal starts within one clock before the start of the signal high period of the first basic circuit.

As illustrated in FIG. 12, the low voltage line $V_{GL}$ is connected to an input terminal of the transistor T9A, the node N1 is connected to an output terminal of the transistor T9A, and the input terminal IN4A is connected to a gate of the transistor T9A. A gate signal $G_{n-4}$ output by an (n-4)-th basic circuit 113-(n−4) is input to the gate of the transistor T9A. In the period P1, the gate signal $G_{n-4}$ becomes high voltage, and the transistor T9A becomes in the on state, and outputs the low voltage of the low voltage line $V_{GL}$ to the node N1. However, since the node N1 is maintained at the low voltage, there is no change in the voltage at the node N1.

As illustrated in FIG. 12, the input terminal IN3 is connected to a gate and an input terminal of the transistor T1A (diode connection), and the node N1 is connected to an output terminal of the transistor T1A. The input terminal IN3A is connected to a gate of the transistor T7A, the low voltage line $V_{GL}$ is connected to an input terminal of the transistor T7A, and the node N2 is connected to an output terminal of the transistor T7A. In the period P4 illustrated in FIG. 13, the gate signal $G_{n+2}$ becomes high voltage, and the transistor T1A becomes in the on state, and outputs the high voltage of the gate signal $G_{n+2}$ to the node N1. However, since the node N1 is maintained at the high voltage, there is no change in the voltage at the node N1. Likewise, in the period P4, the transistor T7A becomes in the on state, and outputs the low voltage of the low voltage line $V_{GL}$ to the node N2. However, since the node N2 is maintained at the low voltage, there is no change in the voltage at the node N2.

Figure 14:
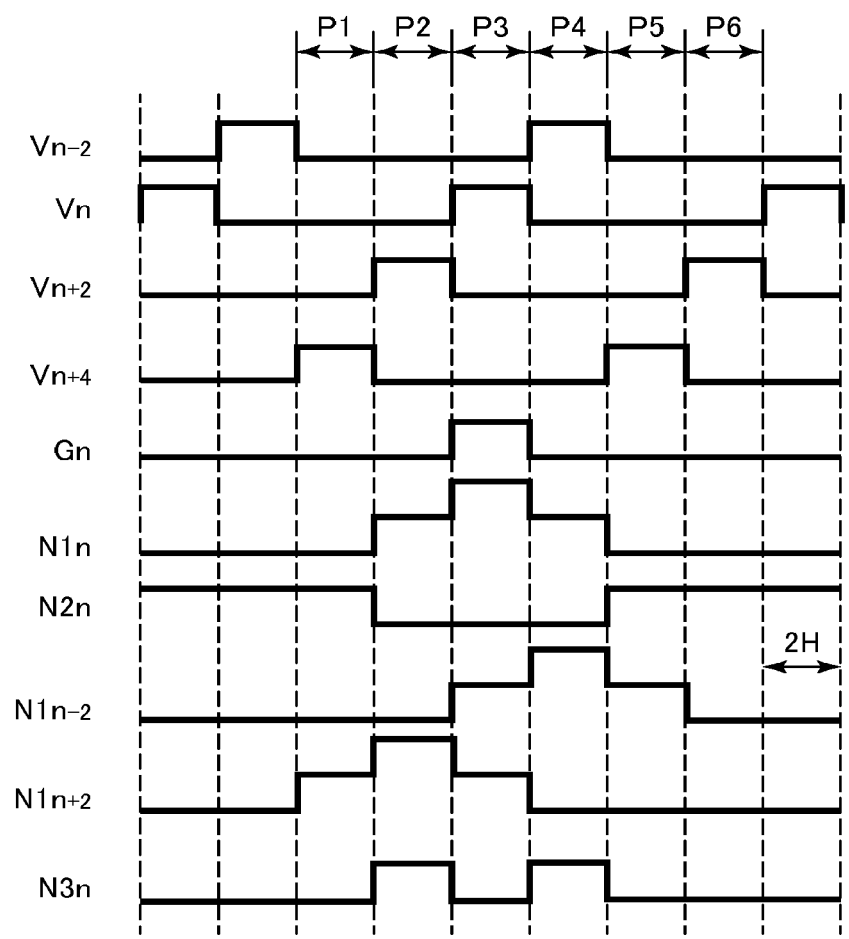
FIG. 14 is a timing chart representing drive operation of the gate signal line drive circuit in reverse scanning according to the fourth embodiment of the present invention.

FIG. 14 is a timing chart representing drive operation of the gate signal line drive circuit 104 in the reverse scanning according to this embodiment. FIG. 14 illustrates changes of the basic clock signals $V_{n-2}$, $V_n$, $V_{n+2}$, $V_{n+4}$, the gate signal $G_n$, and the nodes $N1_n$, $N2_n$, $N1_{n-2}$, $N1_{n+2}$, $N3_n$ in time.

As described above, the second basic clock signal is a clock signal that becomes high voltage later than the first basic clock signal (the basic clock signal $V_n$) by one clock. The fourth basic clock signal is a clock signal that becomes high voltage earlier than the first basic clock signal (the basic clock signal $V_n$) by one clock. In the forward scanning, the second basic clock signal is the basic clock signal and $V_{n+2}$, the fourth basic clock signal is the basic clock signal $V_{n-2}$. In the reverse scanning, the second basic clock signal is the basic clock signal $V_{n-2}$, and the fourth basic clock signal is the basic clock signal $V_{n+2}$. Hence, in this embodiment, the second basic clock signal is input to the input terminal of the transistor T5B (first low voltage application on control element) in the forward scanning, and the fourth basic clock signal is input thereto in the reverse scanning instead of the second basic clock signal. Likewise, the fourth basic clock signal may be input to the input terminal of the transistor T5BA (second low voltage application on control element) in the forward scanning, and the second basic clock signal may be input thereto in the reverse scanning instead of the fourth basic clock signal.

In the period P1 and the previous periods, the node N3 is maintained at the low voltage. The node $N1_{n+2}$ becomes high voltage in the periods P1 to P3, as illustrated in FIG. 14, and the transistor T5B becomes in the on state in the periods P2 to P4. The basic clock signal $V_{n+2}$ becomes high voltage in the period P2, and the transistor T5B outputs the high voltage of the basic clock signal $V_{n+2}$ to the node N3 in the period P2. The basic clock signal $V_n$ becomes high voltage in the period P3, and the transistor T5CA becomes in the on state, and outputs the low voltage of the low voltage line $V_{GL}$ to the node N3. That is, in both of the forward scanning and the reverse scanning, the transistor T5CA becomes in the on state in the period P3 according to the basic clock signal $V_n$, and can stably maintain the voltage of the node N3 at the low voltage. As illustrated in FIG. 14, the node $N1_{n-2}$ becomes high voltage in the periods P3 to P5, and the transistor T5BA becomes in the on state in the periods P3 to P5. The basic clock signal $V_{n-2}$ becomes high voltage in the period P4, and the transistor T5BA outputs the high voltage of the basic clock signal $V_{n-2}$ to the node N3 in the period P4. In the period P5, the basic clock signal $V_{n+4}$ becomes high voltage, and the transistor T5C becomes in the on state, and outputs the low voltage of the low voltage line $V_{GL}$ to the node N3. After the period P6, the basic clock signals $V_n$ and $V_{n+4}$ become cyclically high voltage, and the transistors T5CA and T5C become cyclically in the on state, and output the low voltage of the low voltage line $V_{GL}$ to the node N3. Hence, even in the reverse scanning, the node N3 becomes high voltage in the periods P2 and P4, and becomes low voltage in the other periods.

As described above, the transistors T1A, T7A, and T9A have the same function as that of the transistors T1, T7, and T9 in forward scanning, in reverse scanning, respectively. At the start time of the period P2, the gate signal $G_{n+2}$ output by the (n+2)-th basic circuit 113-(n+2) changes from the low voltage to the high voltage, and the transistor T1A turns on. The transistor T1A applies the high voltage of the gate signal $G_{n+2}$ to the node N1, and the node N1 changes from the low voltage to the high voltage. Likewise, at the start time of the period P2, the transistor T7A turns on, the transistor T7A applies the low voltage of the low voltage line $V_{GL}$ to the node N2, and the node N2 changes from the high voltage to the low voltage. Also, at the start time of the period P5, the gate signal $G_{n-4}$ output by the (n−4)-th basic circuit 113-(n−4) changes from the low voltage to the high voltage, and the transistor T9A turns on. The transistor T9A applies the low voltage of the low voltage line $V_{GL}$ to the node N1, and the node N1 changes from the high voltage to the low voltage.

Also, as described above, the transistors T1, T7, and T9 do not contribute to the voltage changes at the nodes in the reverse scanning. In the period P1, the gate signal $G_{n+4}$ becomes high voltage, and the transistor T9 becomes in the on state, and outputs the low voltage of the low voltage line $V_{GL}$ to the node N1. However, since the node N1 is maintained at the low voltage, there is no change in the voltage at the node N1. In the period P4, the gate signal $G_{n-2}$ becomes high voltage, and the transistor T1 becomes in the on state, and outputs the high voltage of the gate signal $G_{n-2}$ to the node N1. However, since the node N1 is maintained at the high voltage, there is no change in the voltage at the node N1. Likewise, in the period P4, the transistor T7A becomes in the on state, and outputs the low voltage of the low voltage line $V_{GL}$ to the node N2. However, since the node N2 is maintained at the low voltage, there is no change in the voltage at the node N2.

In the forward scanning, in a clock (the period P4 indicated in FIG. 13) after the signal high period (the period P3 indicated in FIG. 13) of the gate signal $G_n$, the transistor T5B outputs the high voltage of the basic clock signal $V_{n+2}$ to the node N3. Further, in a subsequent clock (the period P5 indicated in FIG. 13), the transistor T5C outputs the low voltage of the low voltage line $V_{GL}$ to the node N3 according to the high voltage of the basic clock signal $V_{n+4}$. Also, in the reverse scanning, in a clock (the period P4 indicated in FIG. 14) after the signal high period (the period P3 indicated in FIG. 14) of the gate signal $G_n$, the transistor T5BA outputs the high voltage of the basic clock signal $V_{n-2}$ to the node N3. Further, in a subsequent clock (the period P5 indicated in FIG. 14), the transistor T5C outputs the low voltage of the low voltage line $V_{GL}$ to the node N3 according to the high voltage of the basic clock signal $V_{n+4}(=V_{n-4})$. In this embodiment, four-phase basic clock signals are used, and the basic clock signal $V_{n+4}$ is shifted in phase from the basic clock signal $V_n$ by $\pi$. Hence, in both of the forward scanning and the reverse scanning, the basic clock signal $V_{n+4}$ is a clock signal that becomes high voltage later than the basic clock signal $V_n$ by two clocks, and the transistor T5C becomes in the on state according to the high voltage of the basic clock signal $V_{n+4}$ in the period P5 indicated in FIGS. 13 and 14, and outputs the low voltage of the low voltage line $V_{GL}$ to the node N3. As a result, the node N3 becomes stably low voltage in the period P5. That is, the transistor T5C can perform the same function in both of the forward scanning and the reverse scanning. The same is applied to the transistor T3.

As described above, in the gate signal line drive circuit according to the present invention, in order to enable the bidirectional scanning, the basic clock signals of four or larger phases are necessary, and a value of "m" of the m clocks configuring one cycle of the basic clock signal becomes 4 or larger (m≥4). If "m" is larger than 4, the basic clock signal input to the gate of the transistor T5C may be a clock signal that becomes high voltage since the second basic clock signal changes from the high voltage to the low voltage until the fourth basic clock signal then changes from the low voltage to the high voltage. Also, in both of the forward scanning and the reserve scanning, the transistor T5C turns on after the high voltage of the second basic clock signal has been output to the node N3, and outputs the low voltage to the node N3. However, the present invention is not limited to this configuration. A third low voltage application on control element that is connected in parallel to the first low voltage application on control element (the transistor T5C) may be further provided in the node N3. In the forward scanning, after the high voltage of the second basic clock signal has been output to the node N3, the first low voltage application on control element turns on, and outputs the low voltage to the node N3. In the reverse scanning, after the high voltage of the second basic clock signal has been output to the node N3, the third low voltage application on control element turns on, and outputs the low voltage to the node N3. It is desirable that the signals input to the respective control terminals of the first to third low voltage application on control elements are basic clock signals, but not limited to this signal. For example, the gate signal $G_{n+4}$ may be input to the control terminal of the first low voltage application on control element, and the gate signal $G_{n-4}$ may be input to the control terminal of the third low voltage application on control element.

Figure 15:
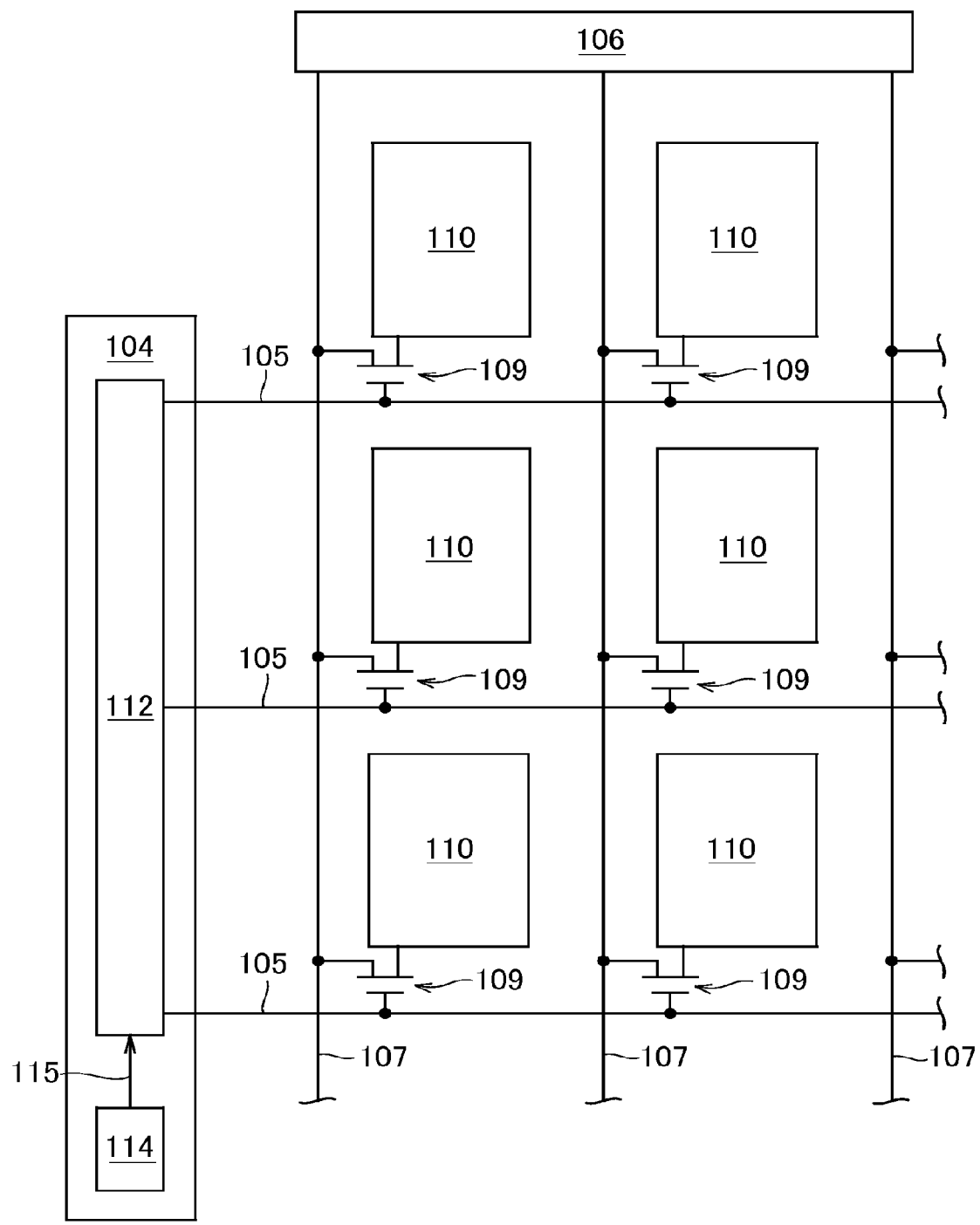
FIG. 15 is a conceptual diagram of an equivalent circuit of a TFT substrate provided in a liquid crystal display device according to another example of the embodiment of the present invention.

In the display device according to the embodiments of the present invention, as illustrated in FIG. 2, the liquid crystal display device of the IPS system has been described. Alternatively, the display device according to the present invention may be configured by a liquid crystal display device of another drive system such as a VA (vertically aligned) liquid crystal display device, or a TN (twisted nematic) liquid crystal display device, or may be configured by another display device such as an organic EL display device. FIG. 15 is a conceptual diagram of an equivalent circuit of a TFT substrate 102 provided in a liquid crystal display device according to another example of the embodiment of the present invention. FIG. 15 illustrates an equivalent circuit of the TFT substrate 102 provided in the VA liquid crystal display device and the TN liquid crystal display device. In the VA liquid crystal display device and the TN liquid crystal display device, the common electrode 111 is disposed on the filter substrate 101 that faces the TFT substrate 102. The present invention can be extensively applied to another gate signal line drive circuit and another display device without being limited to the above embodiments.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A gate signal line drive circuit including a plurality of basic circuits that output respective gate signals which become an ON voltage in a signal ON period which is cyclically repeated, and become an OFF voltage in a signal OFF period which is a period other than the signal ON period to corresponding gate signal lines, each of the basic circuits comprising:

an ON voltage application switching element having an input terminal, a control terminal, and an output terminal electrically connecting to the gate signal line;

an OFF voltage application switching element having an input terminal, a control terminal, and an output terminal electrically connecting to the gate signal line;

a first OFF voltage application on control element having an input terminal, a control terminal, and an output terminal, the output terminal being electrically connected to the control terminal of the OFF voltage application switching element; and a basic clock signal line applying a basic clock signal and electrically connecting to the input terminal of the ON voltage application switching element and the control terminal of the first OFF voltage application on control element, wherein an ON voltage is applied to the control terminal of the ON voltage application switching element according to the signal ON period, to output the basic clock signal to the corresponding gate signal line, wherein an ON voltage is applied to the control terminal of the OFF voltage application switching element at timing to change from the signal ON period to the signal OFF period, to output the OFF voltage to the corresponding gate signal line, and wherein the first OFF voltage application on control element outputs the basic clock signal to the control terminal of the OFF voltage application switching element at timing when the basic clock signal changes from the OFF voltage to the ON voltage.

2. The gate signal line drive circuit according to claim 1, wherein the plurality of basic circuits include a first basic circuit, and a second basic circuit, wherein the signal ON period of the second basic circuit starts within one clock after a start of the signal ON period of the first basic circuit, and wherein the control terminal of the ON voltage application switching element in the second basic circuit is connected to the control terminal of the OFF voltage application on control element in the first basic circuit.

3. The gate signal line drive circuit according to claim 1, wherein each of the basic circuits further comprises a first OFF voltage application off control element that turns on after the first OFF voltage application on control element outputs the ON voltage of the basic clock signal to the control terminal of the OFF voltage application switching element, and outputs the OFF voltage to the control terminal of the OFF voltage application switching element.

4. A gate signal line drive circuit including a plurality of basic circuits that output respective gate signals which become an ON voltage in a signal ON period which is cyclically repeated, and become an OFF voltage in a signal OFF period which is a period other than the signal ON period to corresponding gate signal lines, each of the basic circuits comprising:
- an ON voltage application switching element having an input terminal, a control terminal, and an output terminal electrically connecting to the gate signal line;
- an OFF voltage application switching element having an input terminal, a control terminal, and an output terminal electrically connecting to the gate signal line;
- a first OFF voltage application on control element having an input terminal, a control terminal, and an output terminal, the output terminal being electrically connected to the control terminal of the OFF voltage application switching element; and
- a basic clock signal line applying a basic clock signal to the input terminal of the ON voltage application switching element and the control terminal of the first OFF voltage application on control element, wherein an ON voltage is applied to the control terminal of the ON voltage application switching element according to the signal ON period, to output the basic clock signal to the corresponding gate signal line, wherein an ON voltage is applied to the control terminal of the OFF voltage application switching element at timing to change from the signal ON period to the signal OFF period, to output the OFF voltage to the corresponding gate signal line, and wherein the first OFF voltage application on control element outputs the basic clock signal to the control terminal of the OFF voltage application switching element at timing when the basic clock signal changes from the OFF voltage to the ON voltage.

5. The gate signal line drive circuit according to claim 4, wherein the plurality of basic circuits include a first basic circuit, and a second basic circuit, wherein the signal ON period of the second basic circuit starts within one clock after a start of the signal ON period of the first basic circuit, and wherein the control terminal of the ON voltage application switching element in the second basic circuit is connected to the control terminal of the OFF voltage application on control element in the first basic circuit.

6. The gate signal line drive circuit according to claim 4, wherein each of the basic circuits further comprises a first OFF voltage application off control element that turns on after the first OFF voltage application on control element outputs the ON voltage of the basic clock signal to the control terminal of the OFF voltage application switching element, and outputs the OFF voltage to the control terminal of the OFF voltage application switching element.

* * * * *